(12) United States Patent
Suk et al.

(10) Patent No.: US 12,170,251 B2
(45) Date of Patent: Dec. 17, 2024

(54) SEMICONDUCTOR PACKAGE

(71) Applicant: SAMSUNG ELECTRONICS CO., LTD., Suwon-si (KR)

(72) Inventors: Kyoung Lim Suk, Suwon-si (KR); Seokhyun Lee, Hwaseong-si (KR); Jaegwon Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 805 days.

(21) Appl. No.: 17/317,368

(22) Filed: May 11, 2021

(65) Prior Publication Data
US 2022/0102282 A1 Mar. 31, 2022

(30) Foreign Application Priority Data

Sep. 25, 2020 (KR) .......................... 10-2020-0125174

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/6835* (2013.01); *H01L 23/3128* (2013.01);
(Continued)

(58) Field of Classification Search
CPC ............. H01L 23/5389; H01L 21/4853; H01L 21/4857; H01L 21/563; H01L 21/565; H01L 21/568; H01L 21/6835; H01L 23/3128; H01L 23/3135; H01L 23/5383; H01L 23/5386; H01L 24/19; H01L 24/20; H01L 24/24; H01L 25/105; H01L 2221/68372; H01L 2224/214; H01L 2224/24265; H01L 2225/1035;
(Continued)

(56) References Cited

U.S. PATENT DOCUMENTS 9,385,095 B2 7/2016 Jeng et al.
9,875,911 B2 1/2018 Pagaila et al.
(Continued)

FOREIGN PATENT DOCUMENTS

CN 208674106 U 3/2019

*Primary Examiner* — Fernando L Toledo
*Assistant Examiner* — Neil R Prasad
(74) *Attorney, Agent, or Firm* — Myers Bigel, P.A.

(57) ABSTRACT

Disclosed is a semiconductor package comprising a redistribution substrate that has a first trench that extends through a top surface of the redistribution substrate, a first semiconductor chip on the redistribution substrate, a capacitor chip on a bottom surface of the first semiconductor chip, and an under-fill layer on the bottom surface of the first semiconductor chip. The redistribution substrate includes a plurality of dielectric layers vertically stacked, a plurality of redistribution patterns in each of the dielectric layers, and a plurality of dummy redistribution patterns in the first trench. The dummy redistribution patterns vertically overlap the first semiconductor chip. An uppermost surface of the dummy redistribution pattern is located at a level higher than a level of a bottom surface of the first trench.

20 Claims, 21 Drawing Sheets

(51) Int. Cl.
  *H01L 21/56* (2006.01)
  *H01L 21/683* (2006.01)
  *H01L 23/00* (2006.01)
  *H01L 23/31* (2006.01)
  *H01L 25/10* (2006.01)

(52) U.S. Cl.
  CPC ...... *H01L 23/3135* (2013.01); *H01L 23/5383* (2013.01); *H01L 23/5386* (2013.01); *H01L 24/19* (2013.01); *H01L 24/20* (2013.01); *H01L 24/24* (2013.01); *H01L 25/105* (2013.01); *H01L 2221/68372* (2013.01); *H01L 2224/214* (2013.01); *H01L 2224/24265* (2013.01); *H01L 2225/1035* (2013.01); *H01L 2225/1058* (2013.01); *H01L 2924/18162* (2013.01); *H01L 2924/19041* (2013.01); *H01L 2924/19104* (2013.01)

(58) Field of Classification Search
  CPC ... H01L 2225/1058; H01L 2924/18162; H01L 2924/19041; H01L 2924/19104
  See application file for complete search history.

(56) References Cited

U.S. PATENT DOCUMENTS

| | | | |
|---|---|---|---|
| 9,929,130 | B2 | 3/2018 | Kent |
| 10,629,507 | B1 | 4/2020 | Li et al. |
| 2016/0276307 | A1* | 9/2016 | Lin ................ H01L 23/562 |
| 2017/0170109 | A1 | 6/2017 | Lee et al. |
| 2019/0103353 | A1* | 4/2019 | Liu ................ H01L 25/0655 |
| 2019/0385977 | A1* | 12/2019 | Elsherbini ........ H01L 25/16 |
| 2020/0006196 | A1* | 1/2020 | Lin ................ H01L 23/3675 |
| 2020/0098692 | A1 | 3/2020 | Liff et al. |
| 2020/0126883 | A1 | 4/2020 | Wang et al. |
| 2021/0343684 | A1* | 11/2021 | Kim ................ H01L 24/13 |

\* cited by examiner

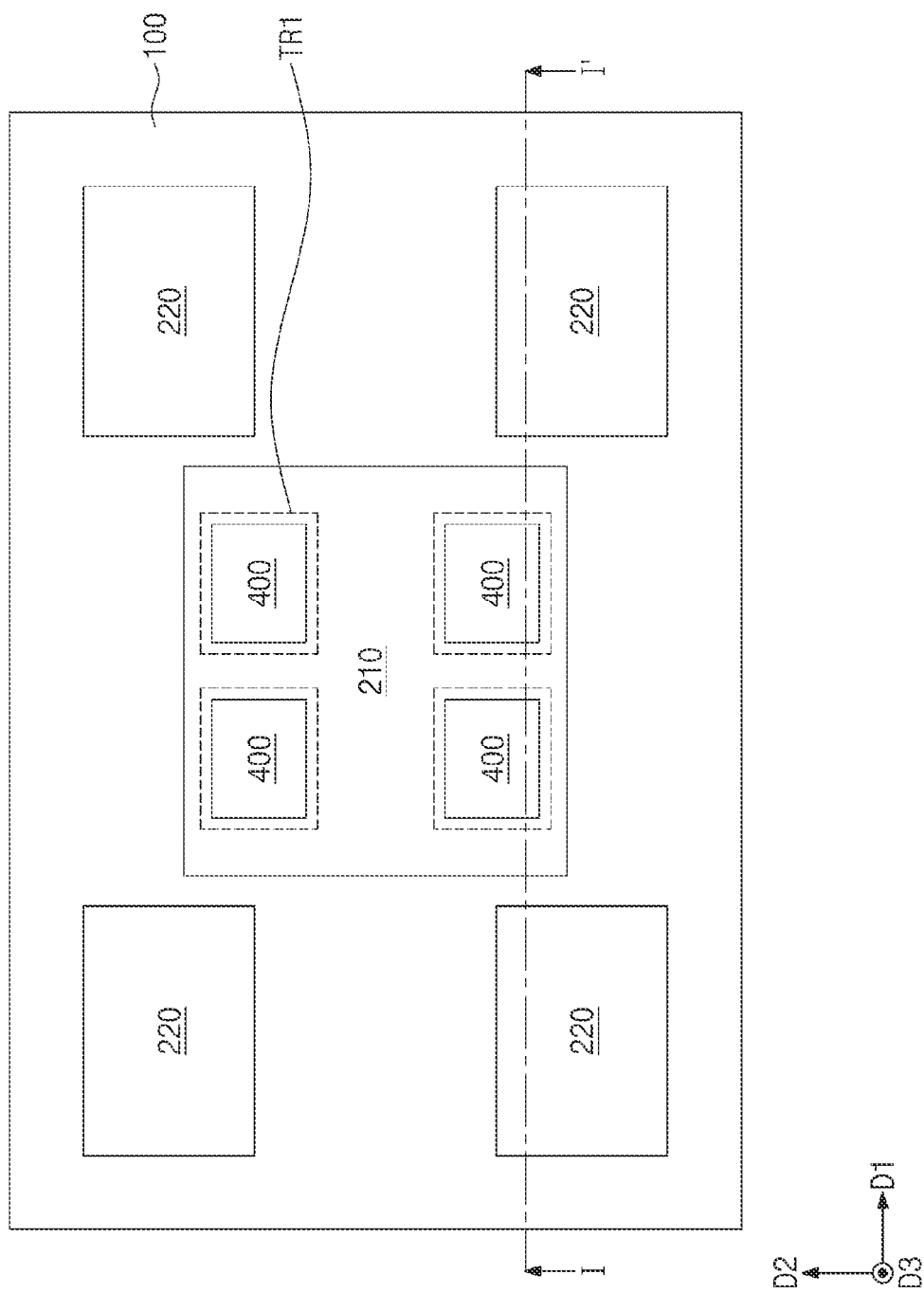

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0125174 filed on Sep. 25, 2020 in the Korean Intellectual Property Office, the disclosure of which is hereby incorporated by reference in its entirety.

BACKGROUND

The present inventive concepts relate to a semiconductor package, and more particularly, to a semiconductor package including a capacitor and a method of fabricating the same.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of the electronics industry, various research has been conducted to improve reliability and durability of semiconductor packages.

SUMMARY

Some example embodiments of the present inventive concepts provide a semiconductor package with increased reliability and a method of fabricating the same.

According to some example embodiments of the present inventive concepts, a semiconductor package may comprise: a redistribution substrate that has a first trench that extends through a top surface of the redistribution substrate; a first semiconductor chip on the redistribution substrate; a capacitor chip on a bottom surface of the first semiconductor chip; and an under-fill layer on the bottom surface of the first semiconductor chip. The redistribution substrate may include: a plurality of dielectric layers vertically stacked; a plurality of redistribution patterns in each of the plurality of dielectric layers; and a plurality of dummy redistribution patterns in the first trench. The plurality of dummy redistribution patterns may vertically overlap the first semiconductor chip. An uppermost surface of each of the dummy redistribution patterns may be located at a level higher than a level of a bottom surface of the first trench.

According to some example embodiments of the present inventive concepts, a semiconductor package may comprise: a redistribution substrate that has a plurality of first trenches that extend through a top surface of the redistribution substrate; a first semiconductor chip on the redistribution substrate; a plurality of capacitor chips on a bottom surface of the first semiconductor chip; and an under-fill layer on the bottom surface of the first semiconductor chip. The redistribution substrate may include: a plurality of dielectric layers vertically stacked; a plurality of redistribution patterns in each of the plurality of dielectric layers; and a stack via between the capacitor chips. The stack via may be connected to the plurality of redistribution patterns and the first semiconductor chip.

According to some example embodiments of the present inventive concepts, a semiconductor package may comprise: a redistribution substrate that has a plurality of first trenches that extend through a top surface of the redistribution substrate; a conductive terminal on a bottom surface of the redistribution substrate; a first semiconductor chip on the redistribution substrate, the first semiconductor chip including a plurality of first chip pads and a plurality of second chip pads; a plurality of capacitor chips on the plurality of second chip pads of the first semiconductor chip, each of the plurality of capacitor chips including a plurality of capacitor chip pads; a plurality of first connection terminals between the plurality of capacitor chips and the plurality of second chip pads; and an under-fill layer on a bottom surface of the first semiconductor chip. The redistribution substrate may include: a plurality of dielectric layers vertically stacked; a plurality of redistribution patterns in each of the dielectric layers, each of the redistribution patterns including a wire part and a via part; a plurality of upper conductive patterns, each upper conductive pattern on the wire part of a respective one of uppermost ones of the redistribution patterns and connected to the first semiconductor chip; a plurality of lower conductive patterns, each lower conductive pattern on the via part of a respective one of lowermost ones of the redistribution patterns and connected to the conductive terminal; a blocking dielectric pattern between the capacitor chips; and a stack via that penetrates the blocking dielectric pattern and is on the redistribution patterns. The stack via may be connected to the redistribution patterns and the first semiconductor chip.

BRIEF DESCRIPTION OF THE DRAWINGS

FIG. 1 illustrates a plan view showing a semiconductor package according to some example embodiments.

DETAILED DESCRIPTION OF EMBODIMENTS

Figure 2A:
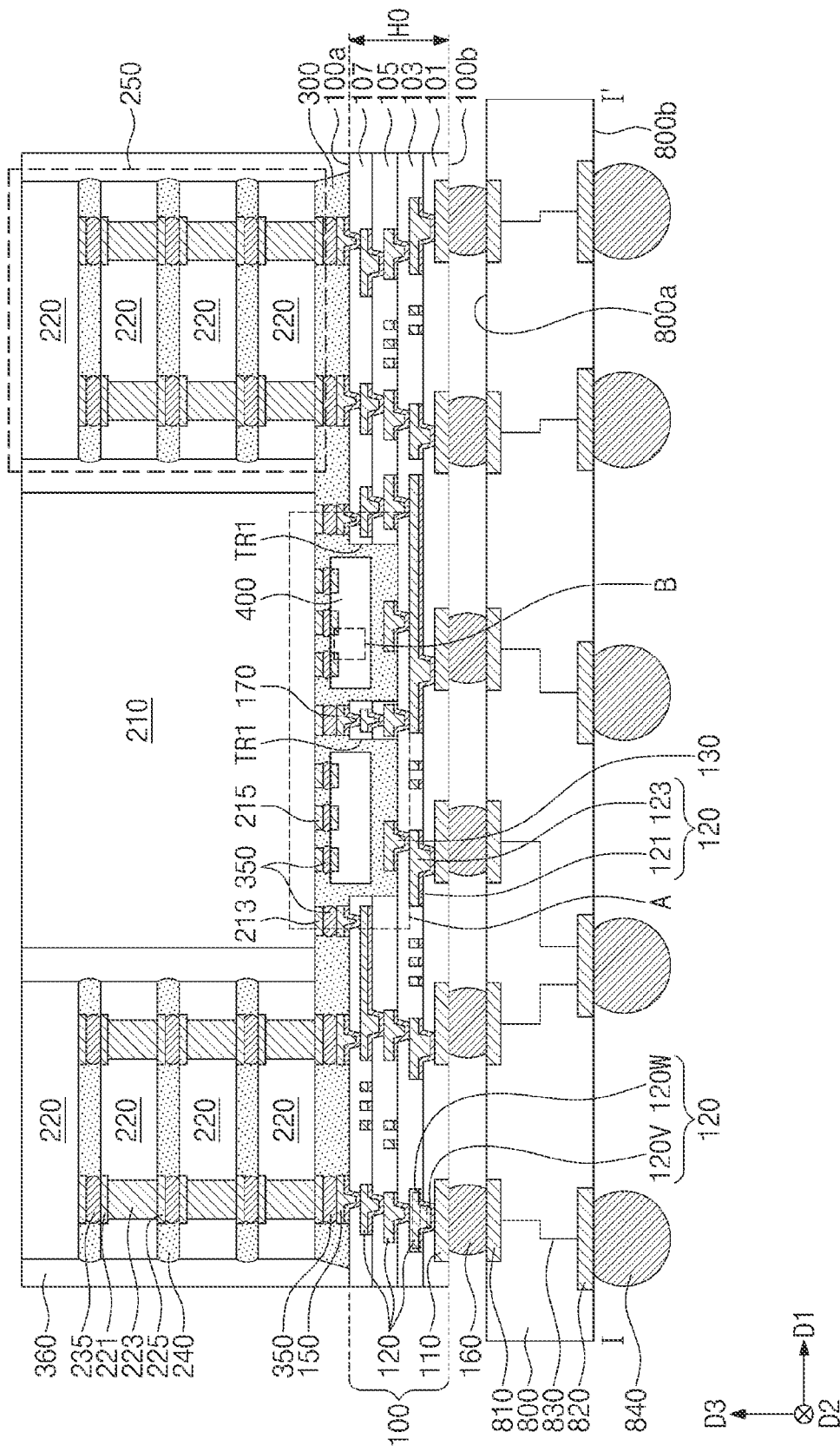
FIG. 2A illustrates a cross-sectional view taken along line I-I' of FIG. 1.

In this description, like reference numerals may indicate like components. The following will now describe semiconductor packages and their fabrication methods according to the present inventive concepts.

Figure 2B:
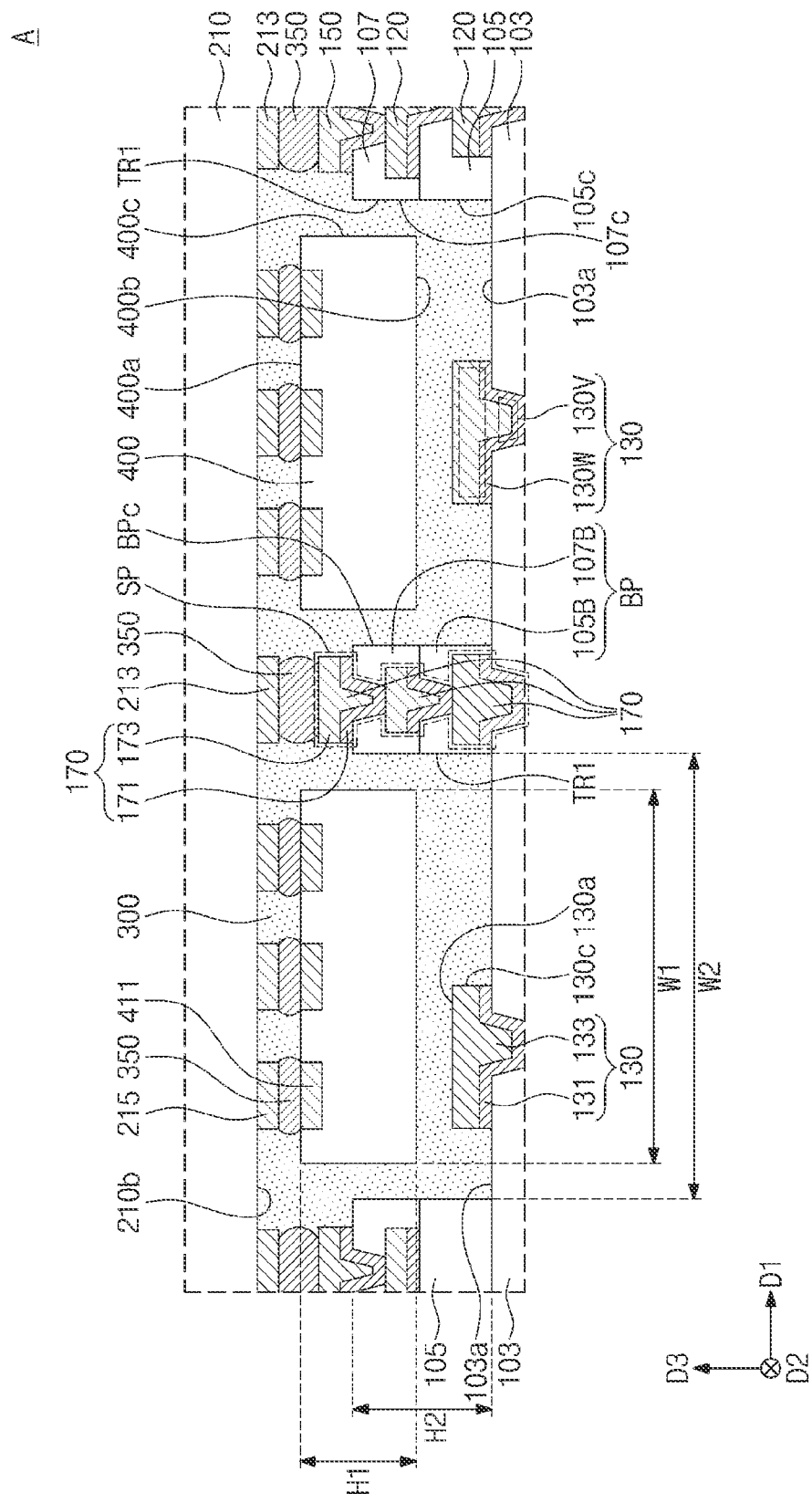
FIGS. 2B and 2C illustrate enlarged views of section A depicted in FIG. 2A, showing a semiconductor package according to some example embodiments.
Figure 2C:
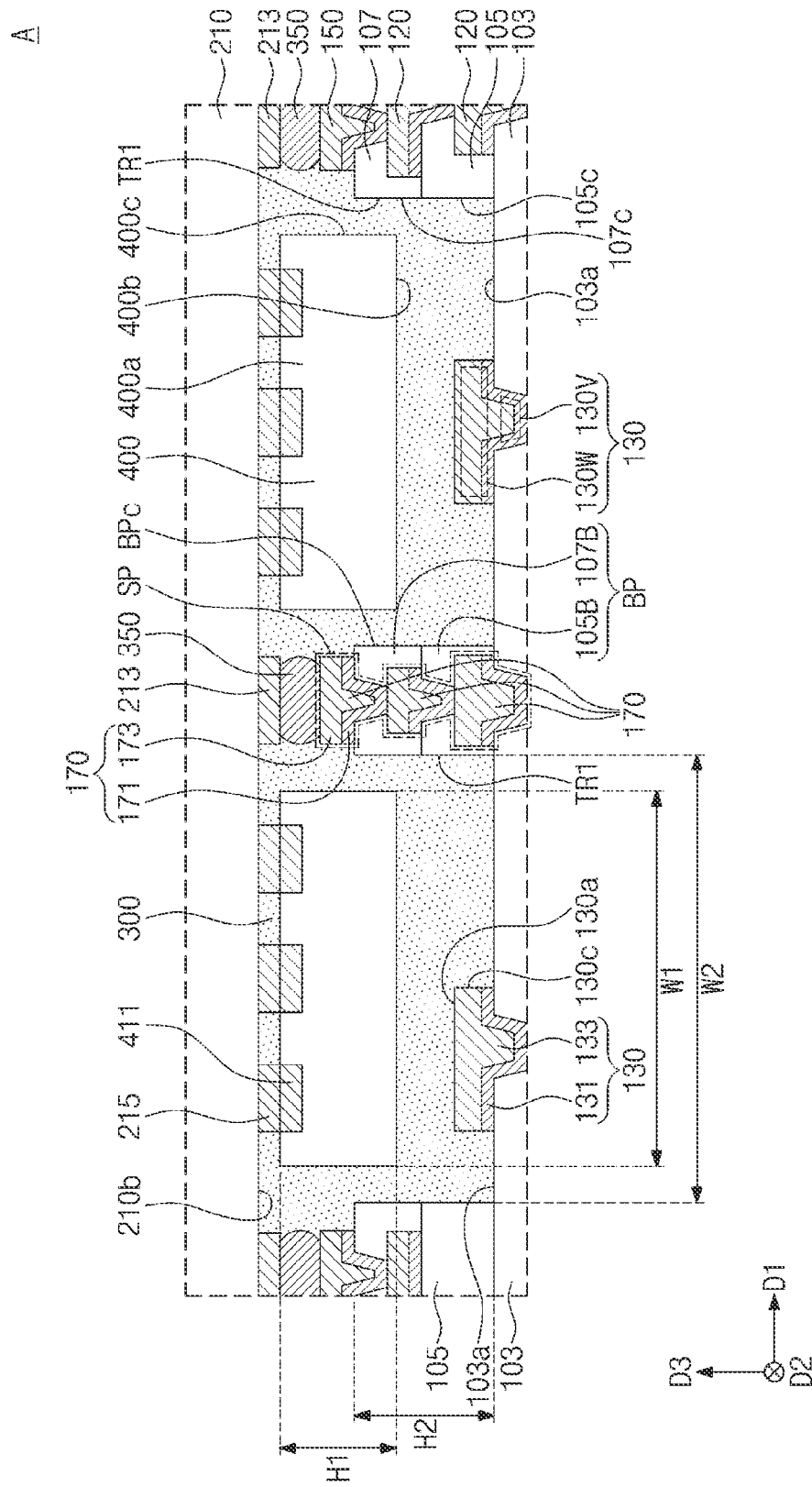

FIG. 1 illustrates a plan view showing a semiconductor package according to some example embodiments. FIG. 2A illustrates a cross-sectional view taken along line I-I' of FIG. 1. FIGS. 2B and 2C illustrate enlarged views of section A depicted in FIG. 2A, showing a semiconductor package according to some example embodiments.

Referring to FIGS. 1 and 2A, a semiconductor package 10 according to some example embodiments of the present inventive concepts may include a package substrate 800, a redistribution substrate 100, a first semiconductor chip 210, a capacitor chip 400, a chip stack 250, an under-fill layer 300, and an upper molding layer 360.

The package substrate 800 may include a printed circuit board, a first metal pad 810, a second metal pad 820, and a metal line 830. The metal line 830 may be provided in the package substrate 800. In this description, the phrase "coupled/connected to the package substrate 800" may mean "coupled/connected to the metal lines 830." The package substrate 800 may be provided on its top surface 800a with the first metal pad 810 electrically connected to the metal line 830. The package substrate 800 may be provided on its bottom surface 800b with the second metal pad 820 electrically connected to the metal line 830. The second metal pad 820 may be provided on its bottom surface with an external coupling terminal 840 coupled to the metal line 830. External electrical signals may be transferred through the external coupling terminal 840 to the metal line 830. A solder ball may be used as the external coupling terminal 840. The external coupling terminal 840 may include metal, such as a solder material.

The redistribution substrate 100 may be provided on the top surface 800a of the package substrate 800. The redistribution substrate 100 may include a lower conductive pattern 110, redistribution patterns 120, dummy redistribution patterns 130, an upper conductive pattern 150, dielectric layers 101, 103, 105, and 107, a blocking dielectric pattern BP, and a stack via SP (FIG. 2B). The dielectric layers 101, 103, 105, and 107 may include a first dielectric layer 101, a second dielectric layer 103, a third dielectric layer 105, and a fourth dielectric layer 107. The redistribution substrate 100 may be called an interposer substrate.

The lower conductive pattern 110 may be provided in the first dielectric layer 101. The lower conductive pattern 110 may have a bottom surface that is not covered with the first dielectric layer 101. Therefore, the bottom surface of the lower conductive pattern 110 may be externally exposed. The lower conductive pattern 110 may define a position on which a conductive terminal 160 is disposed. The lower conductive pattern 110 may serve as a pad for the conductive terminal 160. The lower conductive pattern 110 may include a metallic material. For example, the lower conductive pattern 110 may include one or more of copper, tungsten, and titanium. The lower conductive pattern 110 may be provided in plural (i.e., there may be multiple lower conductive patterns 110), and the plurality of lower conductive patterns 110 may be spaced apart from each other in a first direction D1. In this description, the first direction D1 may be parallel to a bottom surface 100b of the redistribution substrate 100. A second direction D2 may be parallel to the bottom surface 100b of the redistribution substrate 100, while intersecting the first direction D1. A third direction D3 may be orthogonal to each of the first and second directions D1 and D2.

The first, second, third, and fourth dielectric layers 101, 103, 105, and 107 may be provided on the lower conductive patterns 110. The first dielectric layer 101 may cover top and lateral surfaces of the lower conductive patterns 110. The first dielectric layers 101 may be a lowermost dielectric layer among the first, second, third, and fourth dielectric layers 101, 103, 105, and 107. The first dielectric layer 101 may have a bottom surface that corresponds to the bottom surface 100b of the redistribution substrate 100. The bottom surface of the first dielectric layer 101 may be located at substantially the same level as that of the bottom surfaces of the lower conductive patterns 110. For example, the bottom surface of the first dielectric layer 101 may be coplanar with the bottom surfaces of the lower conductive patterns 110. In this description, the term "level" may mean a vertical level, and a level difference may be measured in a direction perpendicular to the bottom surface 100b of the redistribution substrate 100. The first dielectric layer 101 may include an organic material, such as a photosensitive polymer. In this description, the photosensitive polymer may include, for example, one or more of photosensitive polyimide, polybenzoxazole, phenolic polymers, and benzocyclobutene polymers. The first dielectric layer 101 may be a positive photosensitive polymer, but the present inventive concepts are not limited thereto.

The second, third, and fourth dielectric layers 103, 105, and 107 may be sequentially provided on the first dielectric layer 101. The second dielectric layer 103 may cover a top surface of the first dielectric layer 101. The third dielectric layer 105 may cover a top surface of the second dielectric layer 103. The fourth dielectric layer 107 may cover a top surface of the third dielectric layer 105. The fourth dielectric layer 107 may have a top surface that corresponds to a top surface 100a of the redistribution substrate 100. The first, second, third, and fourth dielectric layers 101, 103, 105, and 107 may include the same material. The second, third, and fourth dielectric layer 103, 105, and 107 may include, for example, a photosensitive polymer. An indistinct interface may be provided between the first and second dielectric layers 101 and 103, between the second and third dielectric layers 103 and 105, and between the third and fourth dielectric layers 107, but the present inventive concepts are not limited thereto. The first, second, third, and fourth dielectric layers 101, 103, 105, and 107 may have their lateral surfaces vertically aligned with each other. The redistribution substrate 100 may have a lateral surface that includes the lateral surface of each of the first, second, third, and fourth dielectric layers 101, 103, 105, and 107.

The redistribution patterns 120 may be sequentially provided in the third direction D3 from the top surface of each of the lower conductive patterns 110. The redistribution patterns 120 may be provided in the first, second, third, and fourth dielectric layers 101, 103, 105, and 107. The redistribution patterns 120 may be surrounded by the first, second, third, and fourth dielectric layers 101, 103, 105, and 107.

Each of the redistribution patterns 120 may include a barrier pattern 121 and a conductive pattern 123 provided on the barrier pattern 121. The conductive pattern 123 may be provided on the barrier pattern 121. The barrier pattern 121 may include one or more of copper, titanium, titanium nitride, and tantalum nitride. The conductive pattern 123 may include a metallic material, such as copper, titanium, or an alloy thereof.

Each of the redistribution patterns 120 may include a via part 120V and a wire part 120W. The wire part 120W may be provided on and connected to the via part 120V. The wire part 120W may have a greater width or length than that of the via part 120V. The wire part 120W may have a major axis that extends parallel to the first direction D1. The wire part 120W may extend parallel to the first direction D1, and the via part 120V may protrude from the wire part 120W toward the bottom surface 100b of the redistribution substrate 100. The redistribution patterns 120 may be aligned to allow their via parts 120V to face the bottom surface 100b of the redistribution substrate 100. The via part 120V of each of the redistribution patterns 120 may contact the top surface of one of the lower conductive patterns 110 or the wire part 120W of one of adjacent redistribution patterns 120. The wire part 120W of each of the redistribution patterns 120 may contact the via part 120V of one of adjacent redistribution patterns 120, the upper conductive pattern 150, or a via part 130V of the dummy redistribution pattern 130.

For example, the via parts 120V of the redistribution patterns 120 most adjacent to the lower conductive patterns 110 may correspondingly contact the top surfaces of the lower conductive patterns 110. The conductive pattern 123 of the redistribution pattern 120 may not directly contact the lower conductive pattern 110. The barrier patterns 121 may be correspondingly interposed between the conductive patterns 123 of the redistribution patterns 120 and the top surfaces of the lower conductive patterns 110. The barrier patterns 121 may directly contact the top surfaces of the lower conductive patterns 110. Alternatively, the via parts 120V of some of the redistribution patterns 120 may correspondingly contact the top surfaces of adjacent redistribution patterns 120.

Each of the via part 120V and the wire part 120W may include the barrier pattern 121 and the conductive pattern 123. The barrier pattern 121 of the via part 120V and the barrier pattern 121 of the wire part 120W may be directly connected to each other with no boundary therebetween. The barrier pattern 121 may be provided on a bottom surface of the conductive pattern 123 included in the via part 120V, and may be interposed between a lateral surface of the conductive pattern 123 included in the via part 120V and an adjacent one of the first, second, third, and fourth dielectric layers 101, 103, 105, and 107 and between a bottom surface of the conductive pattern 123 included in the wire part 120W and an adjacent one of the first, second, third, and fourth dielectric layers 101, 103, 105, and 107. The barrier pattern 121 may extend onto neither a lateral surface nor a top surface of the conductive patterns 123 included in the wire part 120W. The conductive pattern 123 of the via part 120V may be directly connected to the conductive pattern 123 of the wire part 120W.

The upper conductive pattern 150 may be provided on the redistribution patterns 120 adjacent thereto, as illustrated in FIG. 2A. The upper conductive pattern 150 may be provided in plural (i.e., there may be multiple upper conductive patterns 150), and the plurality of upper conductive patterns 150 may each include a barrier pattern and a conductive pattern disposed on the barrier pattern. Each upper conductive pattern 150 may include a via part connected to an adjacent one of the redistribution patterns 120 and a pad part on the via part. The pad part may be exposed by the fourth dielectric layer 107. The upper conductive patterns 150 may define positions on which first connection terminals 350 are provided. The upper conductive patterns 150 may be coupled to the redistribution patterns 120 adjacent thereto. For example, an upper conductive pattern 150 may contact the conductive pattern 123 of a redistribution pattern 120 adjacent thereto. The upper conductive pattern 150 may include a conductive material. For example, the upper conductive pattern 150 may include metal, such as copper, titanium, aluminum, tungsten, or an alloy thereof. The number of the stacked first, second, third, and fourth dielectric layers 101, 103, 105, and 107 may be variously changed without being limited to that shown, and this may be true of the number of the redistribution patterns 120.

Referring to FIGS. 2A and 2B, the redistribution substrate 100 may have first trenches TR1. The first trenches TR1 may be recessed regions in the top surface 100a of the redistribution substrate 100 (i.e., the first trenches TR1 extend through the top surface 100a). When viewed in plan, the first trenches TR1 may overlap the first semiconductor chip 210, as illustrated in FIG. 1. When viewed in plan, the first trenches TR1 may correspondingly overlap a plurality of capacitor chips 400, as illustrated in FIG. 1. For example, one first trench TR1 may have therein a corresponding one of the capacitor chips 400. Each of the first trenches TR1 may expose a top surface 103a of the second dielectric layer 103, a lateral surface 105c of the third dielectric layer 105, and a lateral surface 107c of the fourth dielectric layer 107. Each of the first trenches TR1 may have a bottom surface that corresponds to the top surface 103a of the second dielectric layer 103, and may have an inner wall that includes the lateral surfaces 105c and 107c respectively of the third and fourth dielectric layers 105 and 107. The bottom surfaces 103a of the first trenches TR1 may correspondingly be vertically spaced apart from bottom surfaces 400b of the capacitor chips 400, as illustrated in FIG. 2B. Each of the first trenches TR1 may have a width W2 in the first direction D1 greater than a width W1 in the first direction D1 of each of the capacitor chips 400, as illustrated in FIG. 2B. The width W2 in the first direction D1 of each first trench TR1 may range from about 20 μm to about 50 μm. Each of the first trenches TR1 may have a height H2, ranging from about 2 μm to about 30 μm, in the third direction D3. A value of about 0.1 to about 0.5 may be given as a ratio of the height H2 of each first trench TR1 to a height H0 of the redistribution substrate 100.

The blocking dielectric pattern BP may be provided between the first trenches TR1, as illustrated in FIG. 2B. For example, the blocking dielectric pattern BP may define the first trenches TR1. For example, each of the first trenches TR1 may have one inner wall that corresponds to a lateral surface BPc of the blocking dielectric pattern BP. The blocking dielectric pattern BP may be disposed between the capacitor chips 400. The blocking dielectric pattern BP may include a first blocking dielectric pattern 105B and a second blocking dielectric pattern 107B that are sequentially stacked, as illustrated in FIG. 2B. The first blocking dielectric pattern 105B may be formed simultaneously with the third dielectric layer 105, and the second blocking dielectric pattern 107B may be formed simultaneously with the fourth dielectric layer 107. The blocking dielectric pattern BP may include the same material as that of the first, second, third, and fourth dielectric layers 101, 103, 105, and 107.

The stack via SP may be provided on the redistribution patterns 120. For example, the stack via SP may penetrate the blocking dielectric pattern BP. The stack via SP may be electrically connected to the first semiconductor chip 210 and the redistribution patterns 120. For example, the first semiconductor chip 210 may be electrically connected through the stack via SP to the redistribution substrate 100. The stack via SP may include a plurality of conductive vias 170 that are vertically stacked. The conductive vias 170 may be substantially the same as the redistribution patterns 120 or the upper conductive patterns 150.

For example, each of the conductive vias 170 may include a wire part and a via part. Each of the conductive vias 170 may be configured such that the wire part may be provided on and connected to the via part. The wire part may extend parallel to the first direction D1, and the via part may protrude from the wire part toward the bottom surface 100b of the redistribution substrate 100. The conductive vias 170 may be aligned to allow their via parts to face the bottom surface 100b of the redistribution substrate 100. The via part of each of the conductive vias 170 may contact the wire part of one of adjacent conductive vias 170 or the wire part 120W of one of adjacent redistribution patterns 120. The wire part of each of the conductive vias 170 may contact the via part of one of adjacent conductive vias 170 or the first connection terminals 350. For example, the wire part of an uppermost one of the conductive vias 170 may contact the first connection terminal 350, and the via part of a lowermost one of the conductive vias 170 may contact the redistribution patterns 120.

Each of the conductive vias 170 may include a barrier pattern 171 and a conductive pattern 173. The barrier pattern 171 of each conductive via 170 may be the same as the barrier pattern 121 of the redistribution pattern 120. The conductive pattern 173 of each conductive via 170 may be the same as the conductive pattern 123 of the redistribution pattern 120. The dummy redistribution patterns 130 may be provided on the redistribution patterns 120. A single dummy redistribution pattern 130 will be discussed below for convenience of description. The dummy redistribution pattern 130 may be provided in the first trench TR1. The dummy redistribution pattern 130 may include a dummy barrier pattern 131 and a dummy conductive pattern 133. The dummy conductive pattern 133 may be provided on the dummy barrier pattern 131. The dummy barrier pattern 131 may include one or more of copper, titanium, titanium nitride, and tantalum nitride. The dummy conductive pattern 133 may include a metallic material, such as copper, titanium, or an alloy thereof. The dummy redistribution pattern 130 may not be electrically connected to the first semiconductor chip 210 or the capacitor chips 400.

The dummy redistribution pattern 130 may include a via part 130V and a wire part 130W. The dummy redistribution pattern 130 may be configured such that the wire part 130W may be provided on and electrically connected to the via part 130V. The wire part 130W may have a greater width or length than that of the via part 130V. The wire part 130W may have a major axis that extends parallel to the first direction D1. The via part 130V of the dummy redistribution pattern 130 may penetrate an upper portion of the second dielectric layer 103 to thereby contact the wire part 120W of an adjacent redistribution pattern 120. The via part 130V of the dummy redistribution pattern 130 may be surrounded by the second dielectric layer 103. The wire part 130W of the dummy redistribution pattern 130 may be provided on the top surface 103a of the second dielectric layer 103. The wire part 130W of the dummy redistribution pattern 130 may be exposed to the first trench TR1. For example, the first trench TR1 may expose a top surface 130a of the wire part 130W and a lateral surface 130c of the wire part 130W.

The top surface 130a of the wire part 130W may be defined to refer to a top surface of the dummy redistribution pattern 130, and the lateral surface 130c of the wire part 130W may be defined to refer to a lateral surface of the dummy redistribution pattern 130. The top surface 130a of the dummy redistribution pattern 130 may be located at a level vertically different from that of the bottom surface 103a of the first trench TR1. For example, the top surface 130a of the dummy redistribution pattern 130 may be located at a level higher than that of the bottom surface 103a of the first trench TR1, as illustrated in FIG. 2B. The top surface 130a of the dummy redistribution pattern 130 may be located at a level lower than that of the bottom surface 400b of the capacitor chip 400, as illustrated in FIG. 2B. Differently from that shown, the top surface 130a of the dummy redistribution pattern 130 may be coplanar with the bottom surface 103a of the first trench TR1 in other embodiments.

The first semiconductor chip 210 may be mounted on the top surface 100a of the redistribution substrate 100, as illustrated in FIG. 2A. The first semiconductor chip 210 may be disposed on a central region of the redistribution substrate 100. When viewed in plan, the first semiconductor chip 210 may overlap the first trenches TR1, as illustrated in FIG. 1. In addition, and as illustrated in FIG. 2A, the dummy redistribution pattern 130 are vertically overlapped by the first semiconductor chip 210 (i.e., the first semiconductor chip 210 is "on" the dummy redistribution pattern 130). The first semiconductor chips 210 may include first chip pads 213 and second chip pads 215. The first and second chip pads 213 and 215 may include a metallic material, such as copper, tungsten, titanium, or an alloy thereof. The first and second chip pads 213 and 215 may be exposed on a bottom surface 210b of the first semiconductor chip 210. The first chip pads 213 may connect the first semiconductor chip 210 to the redistribution substrate 100, and the second chip pads 215 may connect the first semiconductor chip 210 to the capacitor chips 400, as illustrated in FIG. 2A. The first semiconductor chip 210 may include integrated circuits therein. The integrated circuits may be adjacent to the bottom surface 210b of the first semiconductor chip 210. The integrated circuits may include a memory circuit, a logic circuit, or a combination thereof. The first and second chip pads 213 and 215 may be electrically connected to the integrated circuits. The first connection terminals 350 may be correspondingly interposed between the first chip pads 213 and the upper conductive patterns 150. The first connection terminal 350 may include one or more of solders, pillars, and bumps. The first connection terminal 350 may include a conductive material, such as a solder material. The solder material may include, for example, tin, bismuth, lead, silver, or an alloy thereof. The first semiconductor chip 210 may be electrically connected through the first connection terminals 350 to the redistribution substrate 100. In this description, the language "connected" may include "physically connected", "directly electrically connected", or "indirectly electrically connected."

The capacitor chips 400 may be mounted on the bottom surface 210b of the first semiconductor chip 210. The capacitor chips 400 may be disposed in the first trenches TR1. The capacitor chips 400 may be horizontally spaced apart from each other across the blocking dielectric pattern BP or the stack via SP. Each of the capacitor chips 400 may include capacitor chip pads 411. The capacitor chip pads 411 may include a metallic material, such as copper, tungsten, titanium, or an alloy thereof. According to some example embodiments, the first connection terminals 350 may be correspondingly interposed between the capacitor chip pads 411 and the second chip pads 215. Each of the capacitor chips 400 may be electrically connected through the first connection terminal 350 to the first semiconductor chip 210. Each of the capacitor chips 400 may have a width W1 in the first direction D1 less than a width in the first direction D1 of the first semiconductor chip 210, as illustrated in FIG. 2B. For example, the width W1 in the first direction D1 of the capacitor chip 400 may range from about 10 μm to about 30 μm. The capacitor chip 400 may have a height H1, ranging from about 1 μm to about 20 μm, in the third direction D3. Each of the capacitor chips 400 may have a planar area less than that of the first semiconductor chip 210.

According to some example embodiments of the present inventive concepts, as shown in FIG. 2C, the first connection terminals 350 may be omitted between the capacitor chip pads 411 and the second chip pads 215. Top surfaces of the capacitor chip pads 411 may correspondingly directly contact bottom surfaces of the second chip pads 215. Therefore, the capacitor chips 400 may be electrically connected to the first semiconductor chip 210 through the capacitor chip pads 411 and the second chip pads 215.

Figure 4:
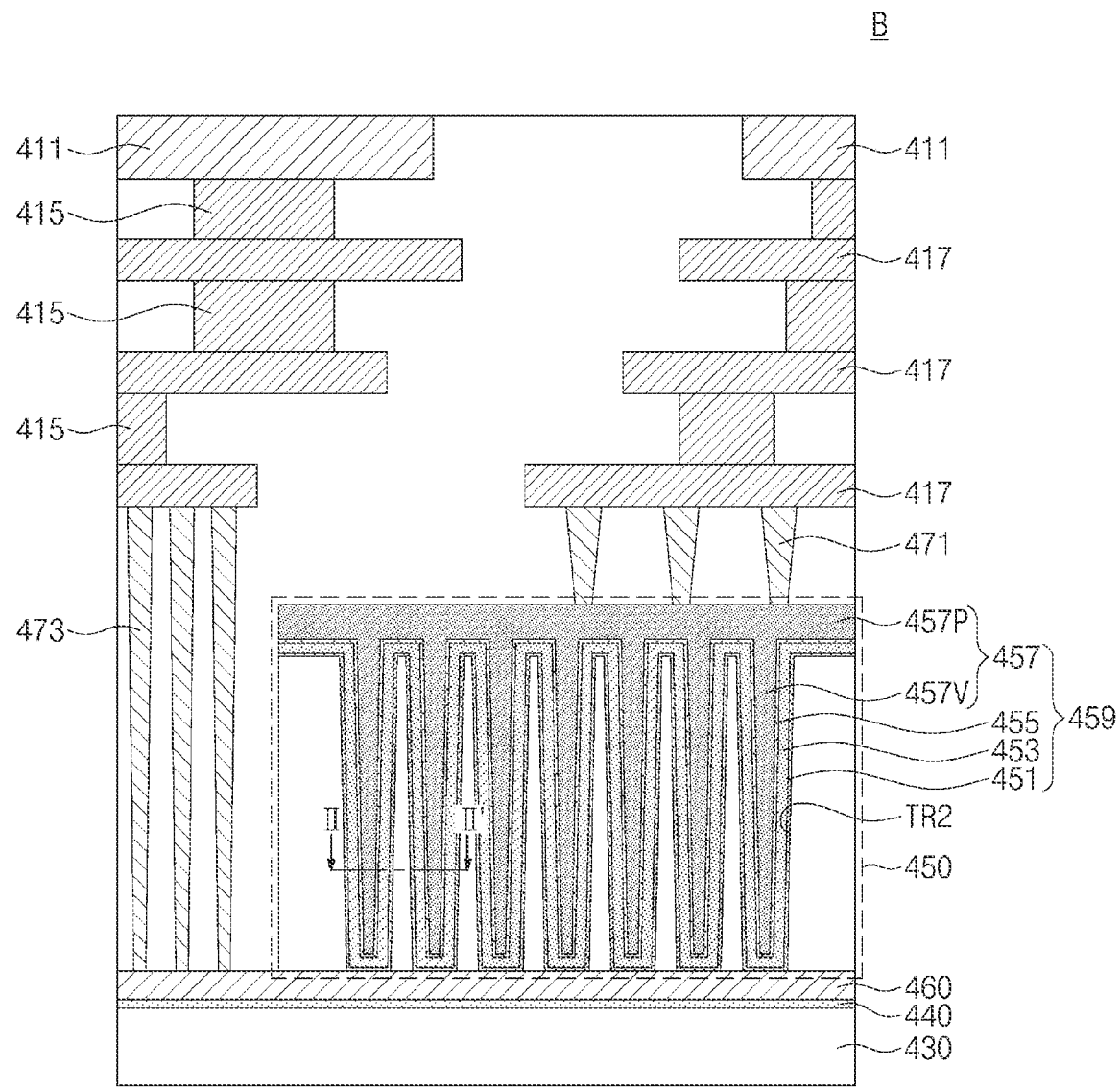
FIG. 4 illustrates an enlarged view of section B depicted in FIG. 2A.
Figure 5:
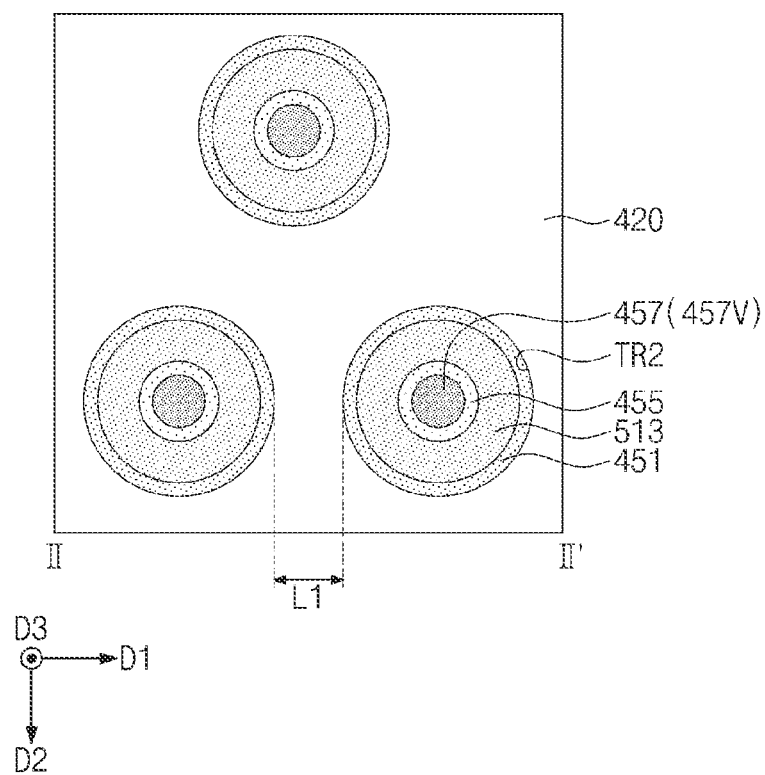
FIG. 5 illustrates a plan view taken along line II-II' of FIG. 4.

FIG. 4 illustrates an enlarged view of section B depicted in FIG. 2A. FIG. 5 illustrates a plan view taken along line II-IF of FIG. 4.

Referring to FIGS. 4 and 5, the capacitor chip (see 400 of FIG. 2A) according to some example embodiments of the present inventive concepts may include a capacitor substrate 430, a common dielectric layer 440, a first conductive layer 460, a capacitor dielectric layer 420, a capacitance structure 459, contacts 471 and 473, wiring lines 417, vias 415, and capacitor chip pads 411.

The capacitor substrate 430 may include, for example, a silicon substrate. The common dielectric layer 440 may be provided on a top surface of the capacitor substrate 430. The common dielectric layer 440 may include a dielectric material, such as one or more of silicon oxide, silicon nitride, and silicon oxynitride. The common dielectric layer 440 may include a single layer or a plurality of layers. The first conductive layer 460 may be provided on the common dielectric layer 440. The first conductive layer 460 may include a metallic material, such as one or more of copper, tungsten, and titanium.

The first conductive layer 460 may be provided thereon with the capacitor dielectric layer 420 that includes a plurality of through holes TR2 at its lower portion. The capacitor dielectric layer 420 may include a dielectric material, such as one or more of silicon oxide, silicon nitride, and silicon oxynitride.

The capacitance structure 459 may be provided in the capacitor dielectric layer 420. The capacitance structure 459 may be provided on the first conductive layer 460, and the capacitor dielectric layer 420 may surround the capacitance structure 459. The capacitance structure 459 may include first, second, third, and fourth layers 451, 453, 455, and 457 that fill the through holes TR2. When viewed in plan, a spacing distance L1 (FIG. 5) between the through holes TR2 may range from about 100 nm to about 200 nm. The first, second, and third layers 451, 453, and 455 may be sequentially provided on inner walls of the through holes TR2. The first, second, and third layers 451, 453, and 455 may conformally cover the inner walls of the through holes TR2. The fourth layer 457 may be provided on the third layer 455. The fourth layer 457 may fill remaining portions of the through holes TR2. Therefore, as shown in FIG. 5, each of the first, second, third, and fourth layers 451, 453, 455, and 457 may have a circular shape or a circular ring shape when viewed in plan. The fourth layer 457 may include via parts 457V that extend into the through holes TR2 and a horizontal part 457P provided on the via parts 457V. The via parts 457V may be connected to the horizontal part 457P. The first, second, third, and fourth layers 451, 453, 455, and 457 may include, for example, one or more of titanium nitride and silicon germanium. The capacitance structure 459 may be a segment in which charges are substantially accumulated in the capacitor chip 400.

First contacts 471 may be provided on the capacitance structure 459, and second contacts 473 may be provided on the first conductive layer 460. The vias 415 and the wiring lines 417 may be provided on the first contacts 471 and the second contacts 473. The vias 415 and the wiring lines 417 may electrically connect the first and second contacts 471 and 473 to the capacitor chip pads 411. The first contacts 471, the second contacts 473, the vias 415, and the wiring lines 417 may include a metallic material, such as one or more of copper, titanium, and tungsten.

Referring back to FIGS. 1 and 2A, the chip stack 250 may be mounted on the redistribution substrate 100. When viewed in plan, the chip stack 250 may be disposed on an outer region of the redistribution substrate 100. The chip stack 250 may be provided in plural (i.e., there may be multiple semiconductor chips 220). The first semiconductor chip 210 may be disposed between the chip stacks 250. The chip stacks 250 may be spaced apart from each other in the first direction D1 or the second direction D2. The chip stacks 250 may be spaced apart in the first direction D1 or the second direction D2 from the first semiconductor chip 210. A single chip stack 250 will be discussed below for convenience of description.

The chip stack 250 may include a plurality of stacked second semiconductor chips 220. Each of the second semiconductor chips 220 may be the same as or similar to the first semiconductor chip 210 of FIGS. 1 and 2A. Alternatively, the second semiconductor chips 220 may be of a different type from the first semiconductor chip 210. For example, the first semiconductor chip 210 may be one of a logic chip, a buffer chip, and a system-on-chip (SOC), and the second semiconductor chip 220 may be another of a logic chip, a buffer chip, and a system-on-chip (SOC). In this description, the memory chip may include a high bandwidth memory (HBM) chip. For example, the first semiconductor chip 210 may be a logic chip, and the second semiconductor chips 220 may be high bandwidth memory (HBM) chips. For another example, a lowermost second semiconductor chip 220 may be a logic chip, and remaining second semiconductor chips 220 may be high bandwidth memory (HBM) chips Each of the second semiconductor chips 220 may include a lower pad 225, a through electrode 223, and an upper pad 221, as illustrated in FIG. 2A. The lower pad 225 and the upper pad 221 may be respectively provided on a bottom surface and a top surface of the second semiconductor chip 220. One or more of the lower and upper pads 225 and 221 may be electrically connected to integrated circuits of the second semiconductor chip 220. The through electrode 223 may be disposed in the second semiconductor chip 220, and may be coupled to the lower pad 225 and the upper pad 221. An uppermost second semiconductor chip 220 may include the lower pad 225, but may not include the through electrode 223 or the upper pad 221. Differently from that shown, the uppermost second semiconductor chip 220 may further include the through electrode 223 and the upper pad 221. Two neighboring second semiconductor chips 220 may have therebetween an interposer terminal 235 coupled to the lower pad 225 and the upper pad 221. Therefore, a plurality of second semiconductor chips 220 may be electrically connected to each other. The interposer terminal 235 may include one of solders, pillars, and bumps. The interposer terminal 235 may include a solder material, but the present inventive concepts are not limited thereto.

Alternatively, the interposer terminal 235 may be omitted. In this case, neighboring second semiconductor chips 220 may be connected through the lower pad 225 and the upper pad 221 that face each other and are directly bonded to each other.

The first connection terminal 350 may be interposed between the lowermost second semiconductor chip 220 and the redistribution substrate 100, and may be coupled to the lower pad 225 and the upper conductive pattern 150 that corresponds to the lower pad 225. Therefore, the second semiconductor chips 220 may be electrically connected through the redistribution substrate 100 to the first semiconductor chip 210 and the conductive terminals 160. A plurality of first connection terminals 350 may have a pitch (i.e., a distance or width therebetween, measured center-to-center, for example) less than that of the conductive terminals 160 and that of the external coupling terminals 840.

The under-fill layer 300 may be provided between the redistribution substrate 100 and the first semiconductor chip 210. For example, the under-fill layer 300 may fill a gap between the redistribution substrate 100 and the first semiconductor chip 210, and may encapsulate the first connection terminals 350. The under-fill layer 300 may surround the capacitor chip 400. The under-fill layer 300 may be interposed between the bottom surface 210*b* of the first semiconductor chip 210 and the bottom surface 103*a* of the first trench TR1. The under-fill layer 300 may extend into a gap between a lateral surface 400*c* of the capacitor chip 400 and the lateral surface BPc of the blocking dielectric pattern BP, and a gap between the bottom surface 400*b* of the capacitor chip 400 and the bottom surface 103*a* of the first trench TR1. Therefore, the under-fill layer 300 may directly contact at least a portion of each of the bottom surface 400*b*, the lateral surface 400*c*, and a top surface 400*a* of the capacitor chip 400, as illustrated in FIG. 2C. The under-fill layer 300 may cover the top and lateral surfaces 130*a* and 130*c* of the dummy redistribution pattern 130, as illustrated in FIG. 2C. For example, the under-fill layer 300 may directly contact the top and lateral surfaces 130*a* and 130*c* of the wire part 130W included in the dummy redistribution pattern 130. The under-fill layer 300 may fill the first trench TR1. For example, the under-fill layer 300 may directly contact the bottom surface 103*a* of the first trench TR1 and the inner sidewalls 105*c* and 107*c* of the first trench TR1, as illustrated in FIG. 2C.

The under-fill layer 300 may be provided between the redistribution substrate 100 and a bottom surface of the chip stack 250, as illustrated in FIG. 2A. For example, the under-fill layer 300 may extend into a gap between the top surface 100*a* of the redistribution substrate 100 and a bottom surface of the lowermost second semiconductor chip 220 included in the chip stack 250, thereby encapsulating the first connection terminals 350. The under-fill layer 300 may directly contact the bottom surface of the lowermost second semiconductor chip 220 included in the chip stack 250. The under-fill layer 300 may include a dielectric polymer, such as an epoxy-based polymer. The under-fill layer 300 may include fillers. The filler may include, for example, one or more of silicon oxide and aluminum oxide.

The upper molding layer 360 may be provided on the top surface 100*a* of the redistribution substrate 100. The upper molding layer 360 may be provided on sidewalls of the chip stacks 250, and may be interposed between the first semiconductor chip 210 and the chip stacks 250, as illustrated in FIG. 2A. The upper molding layer 360 may include a dielectric polymer, such as an epoxy-based polymer. The upper molding layer 360 may have a top surface coplanar with that of the first semiconductor chip 210 and those of the chip stacks 250. The present inventive concepts, however, are not limited thereto, and the upper molding layer 360 may cover the top surface of the first semiconductor chip 210 and the top surfaces of the chip stacks 250. The upper molding layer 360 may have lateral surfaces vertically aligned with those of the redistribution substrate 100.

Figure 3A:
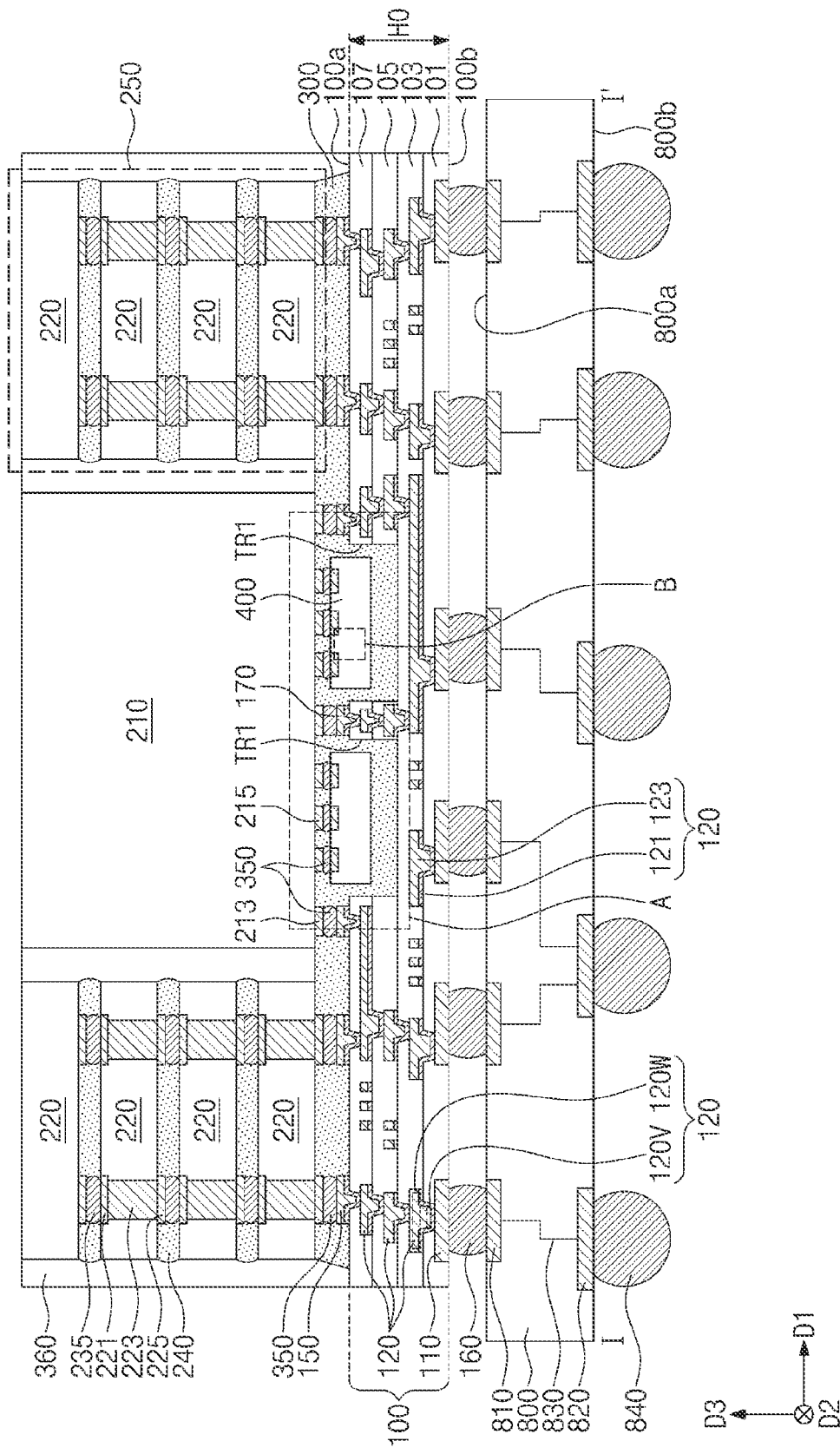
FIG. 3A illustrates a cross-sectional view taken along line I-I' of FIG. 1, showing a semiconductor package according to some example embodiments.
Figure 3B:
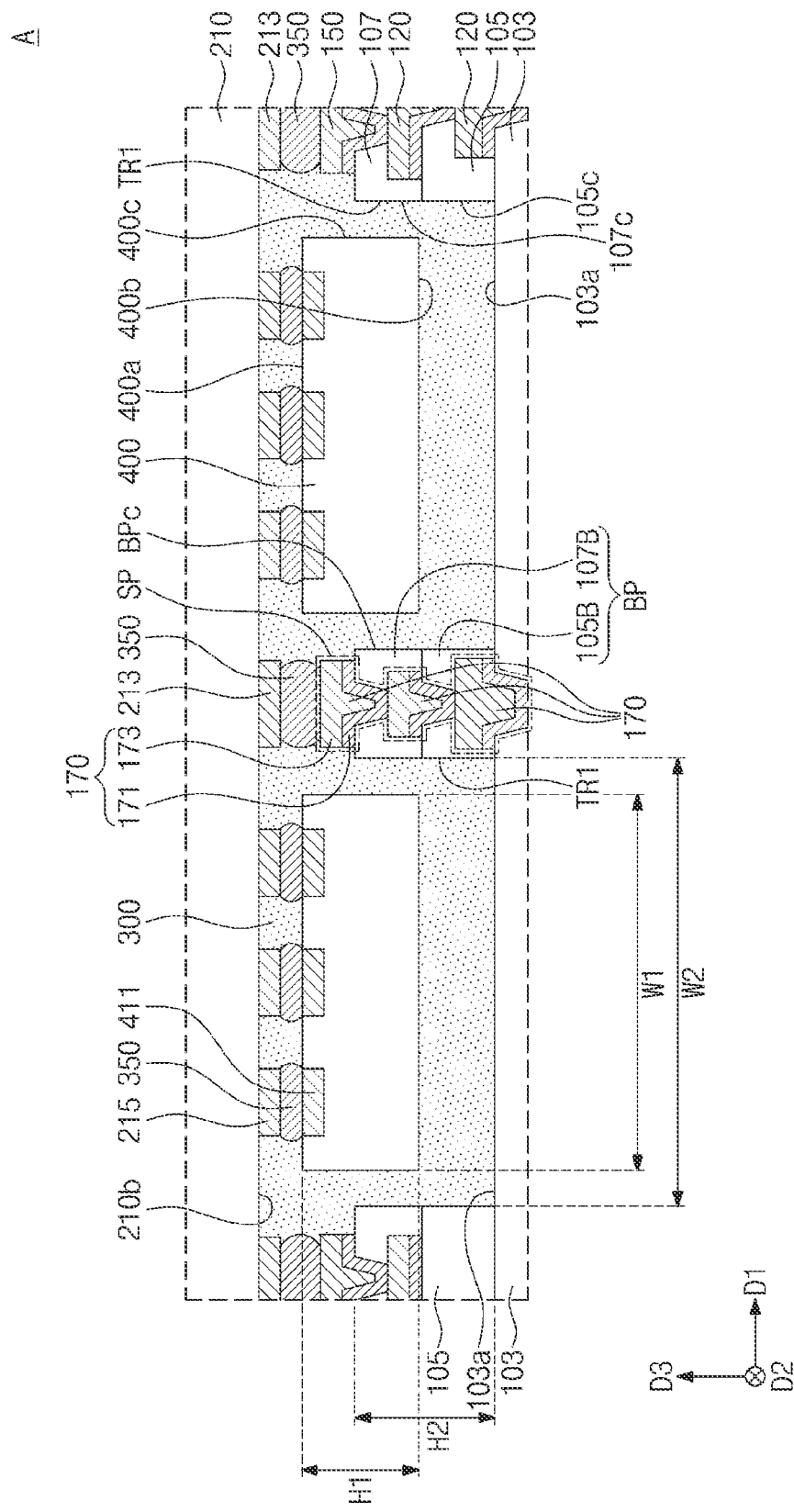
FIGS. 3B and 3C illustrate enlarged views of section A depicted in FIG. 3A, showing a semiconductor package according to some example embodiments.
Figure 3C:
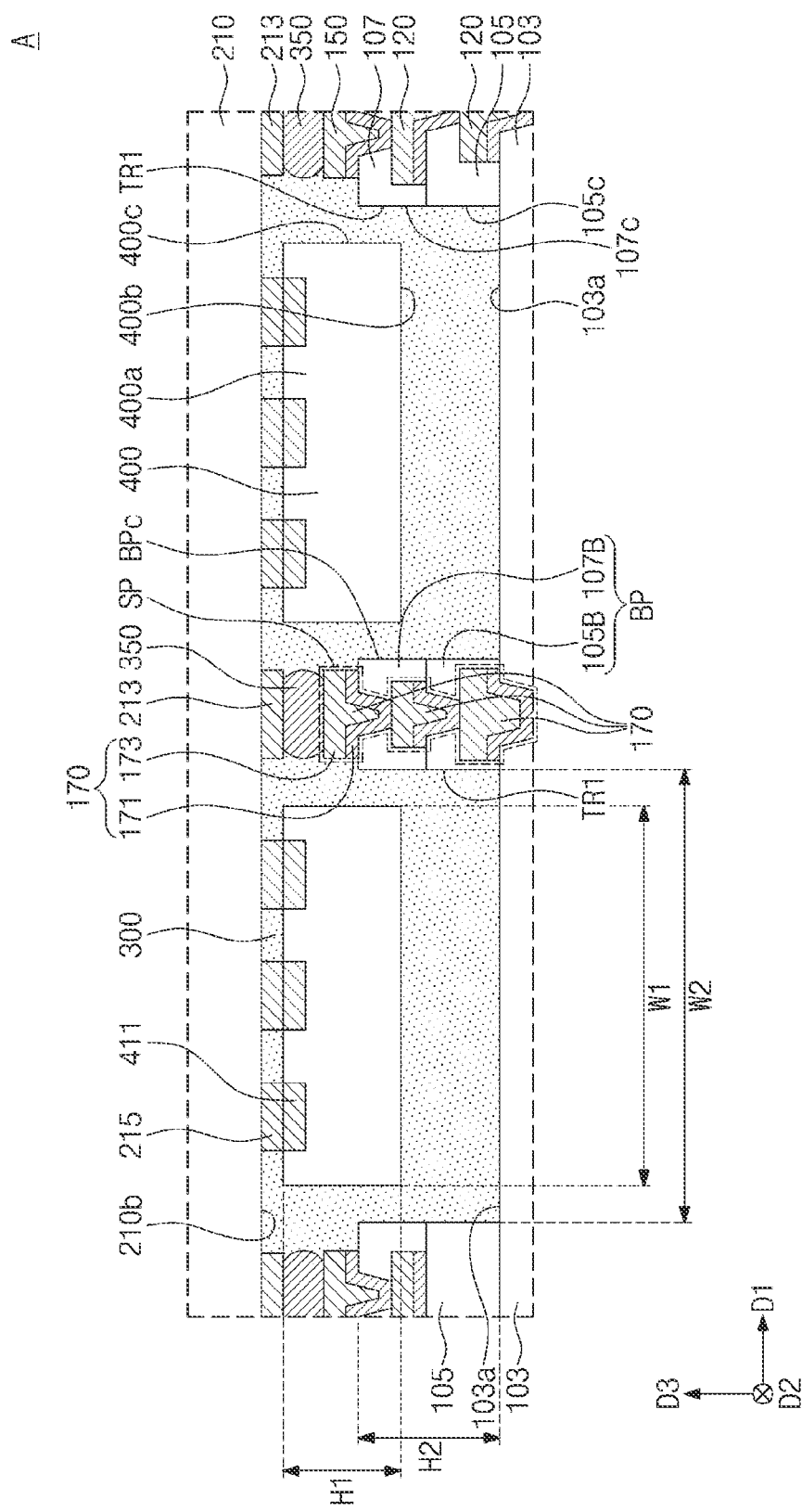

FIG. 3A illustrates a cross-sectional view taken along line I-I' of FIG. 1, showing a semiconductor package according to some example embodiments. FIGS. 3B and 3C illustrate enlarged views of section A depicted in FIG. 3A, showing a semiconductor package according to some example embodiments. In the embodiment that follows, a repetitive description will be omitted, and a difference will be discussed in detail.

Referring to FIGS. 3A and 3B, a semiconductor package 11 according to some example embodiments of the present inventive concepts may include a package substrate 800, a redistribution substrate 100, a first semiconductor chip 210, a capacitor chip 400, chip stacks 250, an under-fill layer 300, and an upper molding layer 360. The package substrate 800, the first semiconductor chip 210, the capacitor chip 400, the chip stacks 250, and the upper molding layer 360 may be substantially the same as those discussed with respect to FIGS. 2A to 2C.

The redistribution substrate 100 may include a lower conductive pattern 110, redistribution patterns 120, an upper conductive pattern 150, dielectric layers 101, 103, 105, and 107, a blocking dielectric pattern BP, and a stack via SP, but may include no dummy redistribution patterns 130 of FIG. 2A. Therefore, the bottom surface 103*a* of each of the first trenches TR1 may be parallel to the bottom surface 400*b* of each of the capacitor chips 400, without exposing the redistribution patterns 120.

The under-fill layer 300 may be provided between the redistribution substrate 100 and the first semiconductor chip 210. For example, the under-fill layer 300 may fill a gap between the redistribution substrate 100 and the first semiconductor chip 210, and may encapsulate the first connection terminals 350. The under-fill layer 300 may surround the capacitor chip 400. The under-fill layer 300 may be interposed between the bottom surface 210*b* of the first semiconductor chip 210 and the bottom surface 103*a* of the first trench TR1. The under-fill layer 300 may extend into a gap between the lateral surface 400*c* of the capacitor chip 400 and the lateral surface BPc of the blocking dielectric pattern BP and a gap between the bottom surface 400*b* of the capacitor chip 400 and the bottom surface 103*a* of the first trench TR1. Therefore, the under-fill layer 300 may directly contact at least a portion of each of the bottom surface 400*b*, the lateral surface 400*c*, and the top surface 400*a* of the capacitor chip 400.

Figure 6:
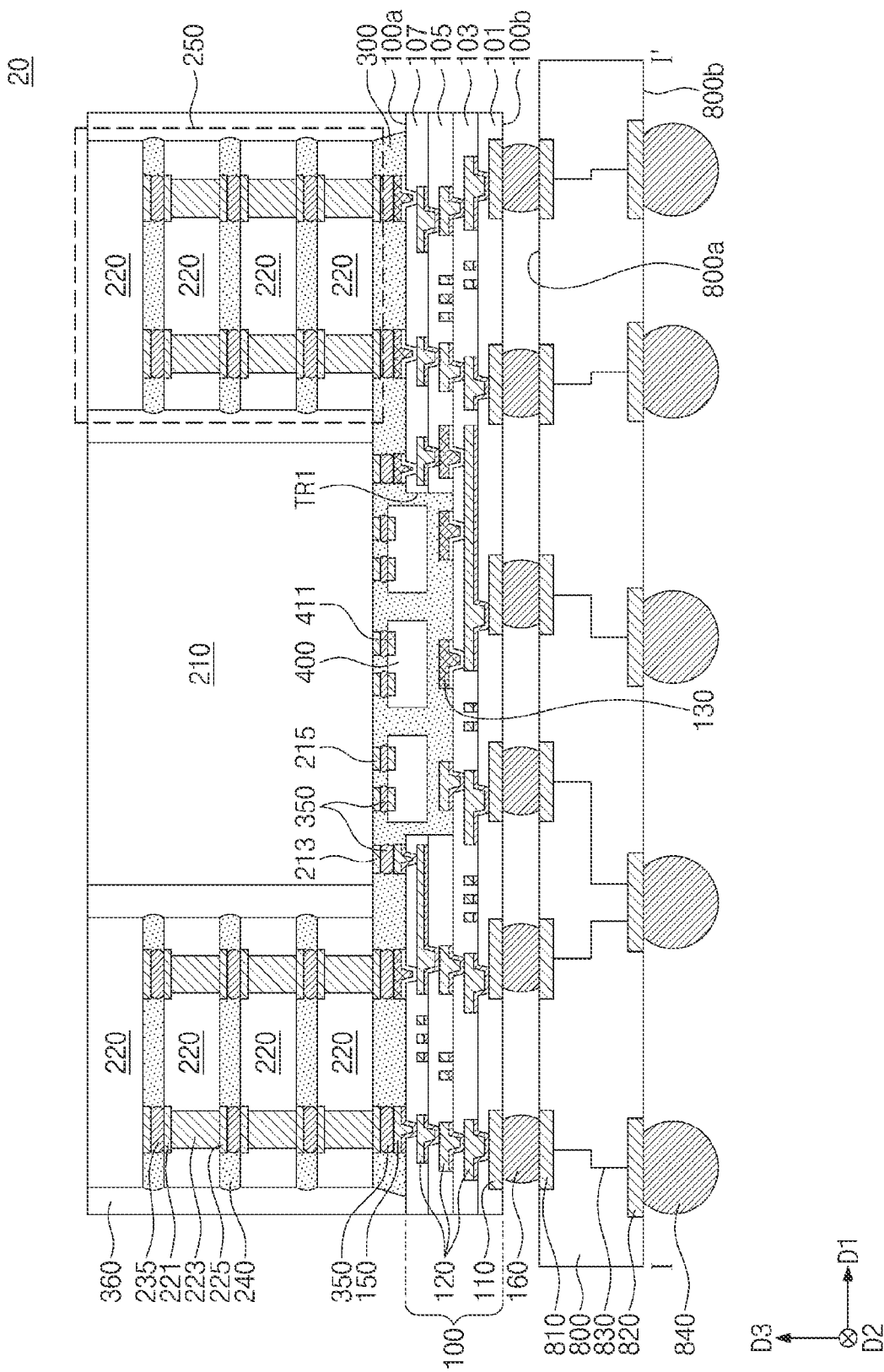
FIG. 6 illustrates a cross-sectional view taken along line I-I' of FIG. 1, showing a semiconductor package according to some example embodiments.

FIG. 6 illustrates a cross-sectional view taken along line I-I' of FIG. 1, showing a semiconductor package according to some example embodiments.

Referring to FIG. 6, a semiconductor package 20 according to some example embodiments of the present inventive concepts may include a package substrate 800, a redistribution substrate 100, a first semiconductor chip 210, a capacitor chip 400, chip stacks 250, an under-fill layer 300, and an upper molding layer 360. The package substrate 800, the first semiconductor chip 210, the capacitor chip 400, the chip stacks 250, the under-fill layer 300, and the upper molding layer 360 may be substantially the same as those discussed with respect to FIGS. 1, 2A to 2C, 4, and 5. In the embodiment that follows, a repetitive description will be omitted, and a difference will be discussed in detail.

Referring to FIG. 6, the redistribution substrate 100 may include a lower conductive pattern 110, redistribution patterns 120, dummy redistribution patterns 130, an upper conductive pattern 150, dielectric layers 101, 103, 105, and 107, but may include neither a blocking dielectric pattern BP nor a stack via SP. The dielectric layers 101, 103, 105, and 107 may include a first dielectric layer 101, a second dielectric layer 103, a third dielectric layer 105, and a fourth dielectric layer 107. The redistribution substrate 100 may be called an interposer substrate.

The redistribution substrate 100 may have a first trench TR1. The first trench TR1 may be a recessed region on a top surface 100a of the redistribution substrate 100. When viewed in plan, the first trench TR1 may overlap the first semiconductor chip 210. A plurality of capacitor chips 400 may be mounted on a bottom surface of the first semiconductor chip 210. When viewed in plan, the first trench TR1 may overlap the capacitor chips 400. The plurality of capacitor chips 400 may be disposed in the first trench TR1. When the plurality of capacitor chips 400 are disposed in one first trench TR1, a space may be saved compared to a case where one capacitor chip 400 is disposed in one first trench TR1, with the result that the semiconductor package 20 may increase in integration.

Figure 7:
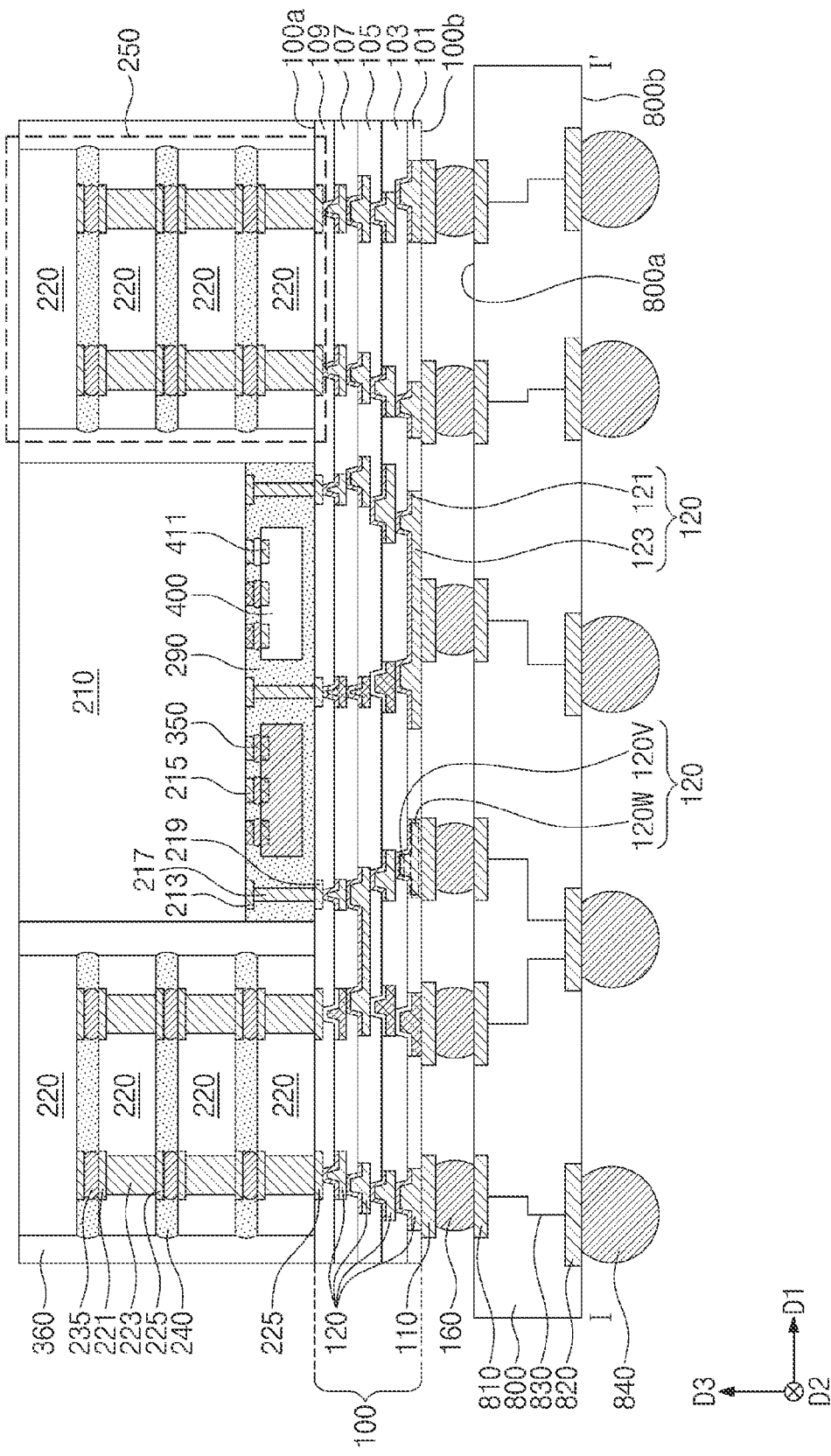
FIG. 7 illustrates a cross-sectional view taken along line I-I' of FIG. 1, showing a semiconductor package according to some example embodiments.

FIG. 7 illustrates a cross-sectional view taken along line I-I' of FIG. 1, showing a semiconductor package according to some example embodiments.

Referring to FIG. 7, a semiconductor package 30 according to some example embodiments of the present inventive concepts may include a package substrate 800, a redistribution substrate 100, a first semiconductor chip 210, a capacitor chip 400, chip stacks 250, and an upper molding layer 360, and may further include a lower molding layer 290 and a conductive post 217. The package substrate 800, the first semiconductor chip 210, the capacitor chip 400, the chip stacks 250, and the upper molding layer 360 may be substantially the same as those discussed with respect to FIGS. 1 to 6. In that embodiment that follows, a repetitive description will be omitted, and a difference will be discussed in detail.

Referring to FIG. 7, the redistribution substrate 100 may include a lower conductive pattern 110, redistribution patterns 120, and dielectric layers 101, 103, 105, 107, and 109. The dielectric layers 101, 103, 105, 107, and 109 may include a first dielectric layer 101, a second dielectric layer 103, a third dielectric layer 105, a fourth dielectric layer 107, and a fifth dielectric layer 109. The redistribution substrate 100 may be called an interposer substrate.

The redistribution substrate 100 may include no dummy redistribution patterns 130 of FIG. 2A. The redistribution patterns 120 may be provided in the first, second, third, fourth, and fifth dielectric layers 101, 103, 105, 107, and 109. The redistribution patterns 120 may be surrounded by the first, second, third, fourth, and fifth dielectric layers 101, 103, 105, 107, and 109. The redistribution patterns 120 may be sequentially provided in the third direction D3 from the top surface of each of the lower conductive patterns 110.

Each of the redistribution patterns 120 may include a conductive pattern 123 and a barrier pattern 121 disposed on the conductive pattern 123. The barrier pattern 121 may include a conductive material, such as copper, titanium, or an alloy thereof. The conductive pattern 123 may include a metallic material, such as copper.

Each of the redistribution patterns 120 may include a via part 120V and a wire part 120W. The via part 120V may be provided on and connected to the wire part 120W. The wire part 120W may have a greater width or length than that of the via part 120V. The wire part 120W may have a major axis that extends in the first direction D1. The wire part 120W may extend parallel to the first direction D1, and the via part 120V may protrude from the wire part 120W toward the top surface 100a of the redistribution substrate 100. The redistribution patterns 120 may be aligned to allow their via parts 120V to face the top surface 100a of the redistribution substrate 100. The wire part 120W of each of the redistribution patterns 120 may contact a top surface of one of the lower conductive patterns 110 or the via part 120V of one of adjacent redistribution patterns 120. The via part 120V of each of the redistribution patterns 120 may contact the lower pad 225 or the wire part 120W of one of adjacent redistribution patterns 120.

The lower molding layer 290 may be provided on a bottom surface of the first semiconductor chip 210. The lower molding layer 290 may be interposed between the top surface 100a of the redistribution substrate 100 and the bottom surface of the first semiconductor chip 210. The lower molding layer 290 may encapsulate the first connection terminals 350, the capacitor chips 400, and the conductive posts 217. The lower molding layer 290 may include a dielectric polymer, such as an epoxy-based polymer. The lower molding layer 290 may have lateral surfaces vertically aligned with those of the first semiconductor chip 210, but the present inventive concepts are not limited thereto.

The lower molding layer 290 may have therein the conductive posts 217 that penetrate therethrough. The conductive posts 217 may be interposed between the first chip pads 213 and third chip pads 219, which third chip pads 219 are provided on a bottom surface of the lower molding layer 290. The conductive posts 217 and the third chip pads 219 may include a metallic material, such as one or more of copper, tungsten, and titanium. The conductive posts 217 may electrically connect the first chip pads 213 to the third chip pads 219. The upper molding layer 360 may cover the lateral surfaces of the first semiconductor chip 210, the lateral surfaces of the chip stacks 250, and the lateral surfaces of the lower molding layer 290.

Figure 8:
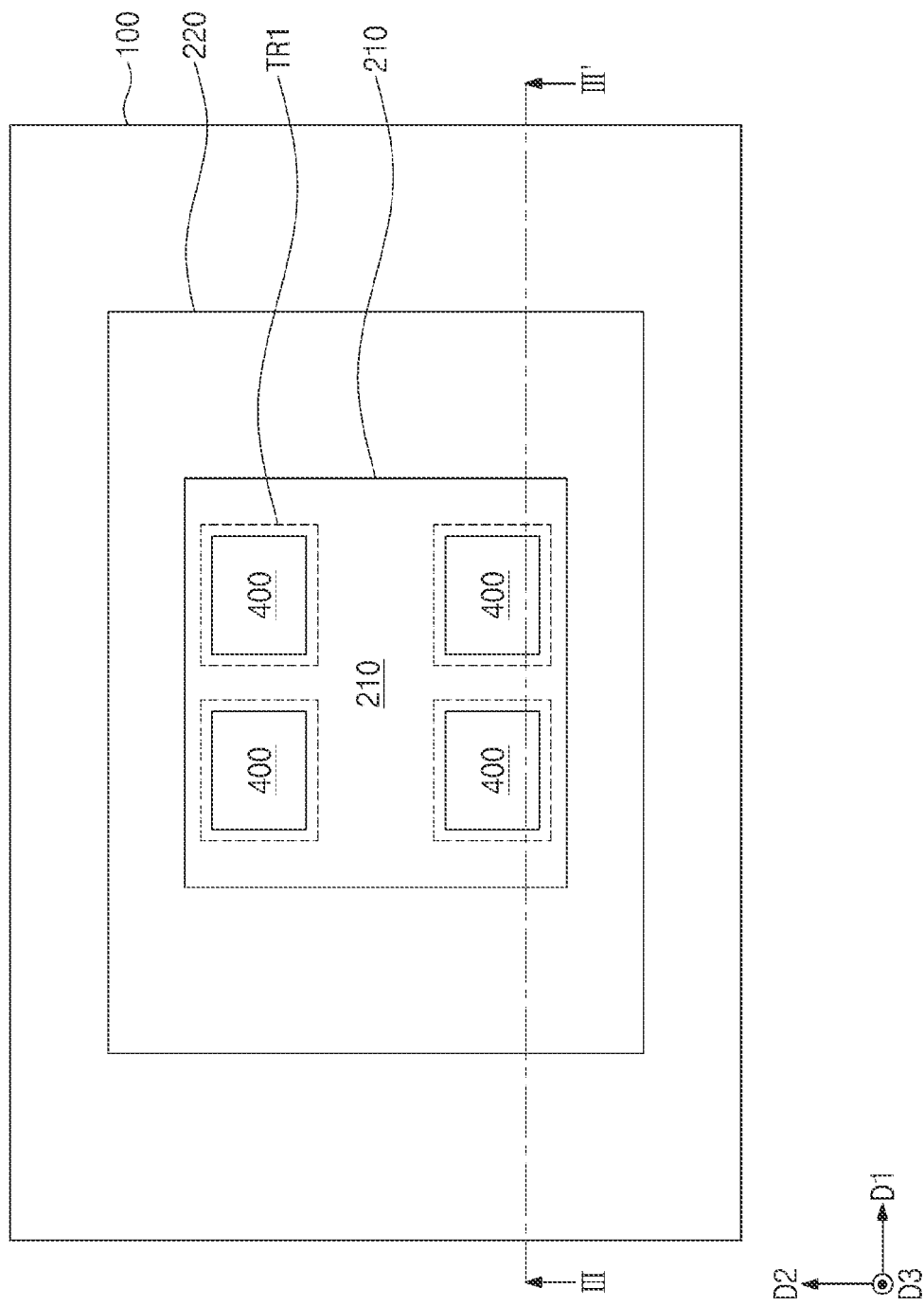
FIG. 8 illustrates a plan view showing a semiconductor package according to some example embodiments.
Figure 9:
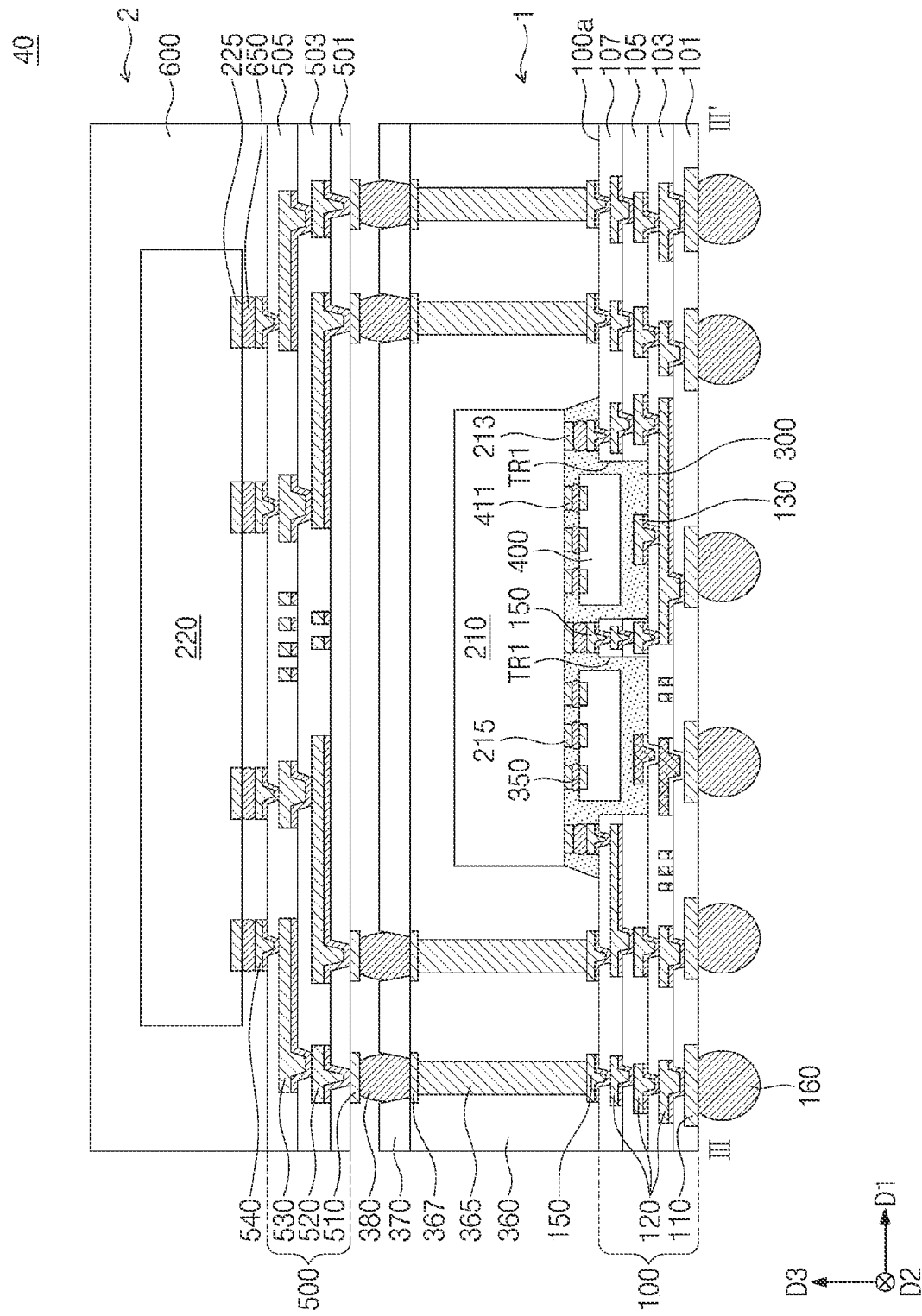
FIGS. 9 and 10 illustrate cross-sectional views taken along line III-III' of FIG. 8, showing a semiconductor package according to some example embodiments.
Figure 10:
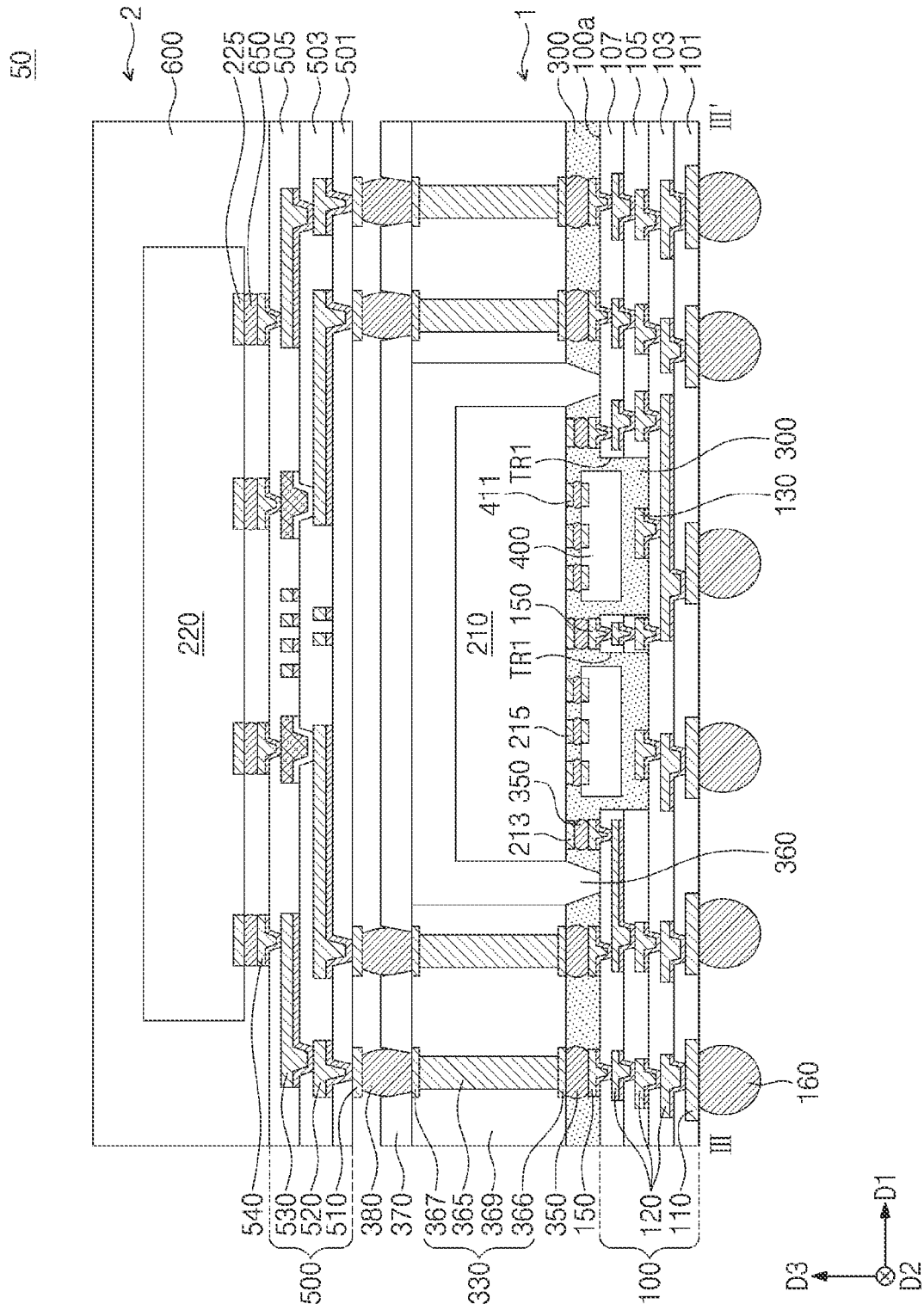

FIG. 8 illustrates a plan view showing a semiconductor package according to some example embodiments. FIGS. 9 and 10 illustrate cross-sectional views taken along line III-III' of FIG. 8, showing a semiconductor package according to some example embodiments.

Referring to FIGS. 8 and 9, a semiconductor package 40 according to some example embodiments of the present inventive concepts may include a first semiconductor package 1 and a second semiconductor package 2 provided on the first semiconductor package 1.

The first semiconductor package 1 may include a first redistribution substrate 100, a first semiconductor chip 210, a capacitor chip 400, an under-fill layer 300, a first upper molding layer 360, a conductive structure 365, an intermediate connection terminal 380, and an intermediate dielectric layer 370.

The first redistribution substrate 100 and the first upper molding layer 360 may be substantially the same as the redistribution substrate 100 and the upper molding layer 360 that are discussed with respect to FIGS. 1 to 2B, and the first semiconductor chip 210 and the capacitor chip 400 may be substantially the same as those discussed with respect to FIGS. 1 to 2B.

The second semiconductor package 2 may include a second redistribution substrate 500, a lower connection pad 510, a second semiconductor chip 220, and a second upper molding layer 600.

The first semiconductor chip 210 may be mounted on the first redistribution substrate 100. The under-fill layer 300 may be provided between the first semiconductor chip 210 and a top surface 100a of the first redistribution substrate 100. The under-fill layer 300 may fill first trenches TR1. The under-fill layer 300 may vertically overlap the first semiconductor chip 210, and may be spaced apart from the conductive structure 365 adjacent thereto.

The first upper molding layer 360 may be provided on the top surface 100a of the first redistribution substrate 100. The first upper molding layer 360 may cover the top surface 100a of the first redistribution substrate 100. The first upper molding layer 360 may include the same material as that of the upper molding layer 360 discussed with respect to FIGS. 1 to 2B. The first upper molding layer 360 may cover top and lateral surfaces of the first semiconductor chip 210, and may also cover a lateral surface of the under-fill layer 300. The first upper molding layer 360 may surround a lateral surface of the conductive structure 365, as illustrated in FIG. 9.

The conductive structure 365 may penetrate the first upper molding layer 360. The conductive structure 365 may extend parallel to the lateral surface of the first semiconductor chip 210. The conductive structure 365 may be interposed between an upper connection pad 367 and an upper conductive pattern 150. The conductive structure 365 may electrically connect the first redistribution substrate 100 to the second redistribution substrate 500.

The upper connection pad 367 may be provided on a top surface of the conductive structure 365. The upper connection pad 367 may have a top surface that is exposed by the intermediate dielectric layer 370. The upper connection pad 367 may define a position on which the intermediate connection terminal 380 is provided. The upper connection pad 367 and the conductive structure 365 may include a metallic material, such as one or more of copper, tungsten, and titanium.

The upper connection pad 367 may be provided with the intermediate connection terminal 380 on its top surface that is exposed by the intermediate dielectric layer 370. The intermediate connection terminal 380 may include one or more of solders, pillars, and bumps. The intermediate connection terminal 380 may include a conductive material, such as a solder material. The solder material may include, for example, tin, bismuth, lead, silver, or an alloy thereof.

The intermediate dielectric layer 370 may be provided on a top surface of the first upper molding layer 360. The intermediate dielectric layer 370 may cover the top surface of the first upper molding layer 360, but may not cover the top surface of the upper connection pad 367. The intermediate dielectric layer 370 may include a dielectric material, such as one or more of silicon oxide, silicon nitride, and silicon oxynitride.

As illustrated in FIG. 9, the second semiconductor package 2 may be provided on the first semiconductor package 1. For example, the second redistribution substrate 500 may be provided on a plurality of intermediate connection terminals 380. The second redistribution substrate 500 may include first, second, and third upper dielectric layers 501, 503, and 505, and may also include upper redistribution patterns 520 and 530. Unlike the first redistribution substrate 100, the second redistribution substrate 500 may not include a trench. The first, second, and third upper dielectric layers 501, 503, and 505 and the upper redistribution patterns 520 and 530 of the second redistribution substrate 500 may be substantially the same as the first, second, third, and fourth dielectric layers 101, 103, 105, and 107 and the redistribution patterns 120 of the first redistribution substrate 100.

The lower connection pad 510 may be provided on a bottom surface of a lowermost one 520 of the upper redistribution patterns 520 and 530. The lower connection pad 510 may serve as a pad for the intermediate connection terminal 380. The lower connection pad 510 may electrically connect the upper redistribution patterns 520 and 530 to the intermediate connection terminal 380.

An upper conductive pattern 540 may be provided on a top surface of an uppermost one 530 of the upper redistribution patterns 520 and 530. The upper conductive pattern 540 may be substantially the same as the upper conductive pattern 150 of the first semiconductor package 1. The second semiconductor chip 220 may be mounted on the upper conductive pattern 540. The second semiconductor chip 220 may be substantially the same as the second semiconductor chip 220 discussed with respect to FIGS. 1 to 2C. The second semiconductor chip 220 may include a lower pad 225, and a second connection terminal 650 may be provided between the lower pad 225 and the upper conductive pattern 540. The second connection terminal 650 may be substantially the same as the first connection terminal 350 discussed with respect to FIGS. 1 to 2C.

The second upper molding layer 600 may be provided on the second redistribution substrate 500. The second upper molding layer 600 may include the same material as that of the first upper molding layer 360. The second upper molding layer 600 may cover top and lateral surfaces of the second semiconductor chip 220 and may encapsulate a plurality of second connection terminals 650. The second upper molding layer 600 may have lateral surfaces vertically aligned with those of the second redistribution substrate 500, but the present inventive concepts are not limited thereto.

Referring to FIG. 10, a semiconductor package 50 according to some example embodiments of the present inventive concepts may include a first semiconductor package 1 and a second semiconductor package 2 provided on the first semiconductor package 1.

The first semiconductor package 1 may include a first redistribution substrate 100, a first semiconductor chip 210, a capacitor chip 400, an under-fill layer 300, a first upper molding layer 360, a connection substrate 330, an intermediate connection terminal 380, and an intermediate dielectric layer 370.

The first redistribution substrate 100 and the first upper molding layer 360 may be substantially the same as the redistribution substrate 100 and the upper molding layer 360 that are discussed with respect to FIGS. 1 to 2B, and the first semiconductor chip 210 and the capacitor chip 400 may be substantially the same as those discussed with respect to FIGS. 1 to 2B.

The second semiconductor package 2 may be substantially the same as the second semiconductor package 2 discussed with respect to FIG. 10.

The connection substrate 330 may be disposed on the first redistribution substrate 100. The connection substrate 330 may have a substrate hole that penetrates therethrough. For example, a substrate hole may be formed to penetrate top and bottom surfaces of a printed circuit board, which process may fabricate the connection substrate 330. When viewed in plan, the substrate hole may be formed on a central portion of the first redistribution substrate 100. The first semiconductor chip 210 may be disposed in the substrate hole of the connection substrate 330. The first semiconductor chip 210 may be spaced apart from an inner wall of the connection substrate 330.

The connection substrate 330 may include a base layer 369 and a conductive structure 365, 366, and 367. The base layer 369 may include a single layer or a plurality of stacked layers. The base layer 369 may include a dielectric material. For example, the base layer 369 may include a carbon-based material, a ceramic, or a polymer. The substrate hole may penetrate the base layer 369. The conductive structure 365, 366, and 367 may be provided in the base layer 369. The conductive structure 365, 366, and 367 may include upper connection pads 367, lower connection pads 366, and vias 365. The upper connection pads 367 and the lower connection pads 366 may be respectively exposed on a top surface and a bottom surface of the connection substrate 330. The vias 365 may be provided between the upper connection pads 367 and the lower connection pads 366. The vias 365 may penetrate the base layer 369, and may be correspondingly coupled to the upper connection pads 367 and the lower connection pads 366. The upper connection pad 367, the lower connection pad 366, and the via 365 may be vertically aligned with each other, but the present inventive concepts are not limited thereto. The conductive structure 365, 366, and 367 may include metal. The conductive structure 365, 366, and 367 may include, for example, at least one selected from copper, aluminum, tungsten, titanium, tantalum, iron, and an alloy thereof.

First connection terminals 350 may be disposed between the first redistribution substrate 100 and the connection substrate 330. The first connection terminals 350 may be interposed between and coupled to corresponding upper connection pads 367 and corresponding upper conductive patterns 150. The conductive structure 365 and 367 may be electrically connected through the first connection terminals 350 to the first redistribution substrate 100. The first connection terminals 350 may include one or more of solder balls, bumps, and pillars. The first connection terminals 350 may include a metallic material. The under-fill layer 300 may be provided in a gap between the first redistribution substrate 100 and the connection substrate 330, thereby encapsulating the first connection terminals 350. The under-fill layer 300 may include a dielectric polymer.

[Fabrication Method]

FIGS. 11 to 19 illustrate cross-sectional views showing a method of fabricating a semiconductor package according to some example embodiments.

Figure 11:
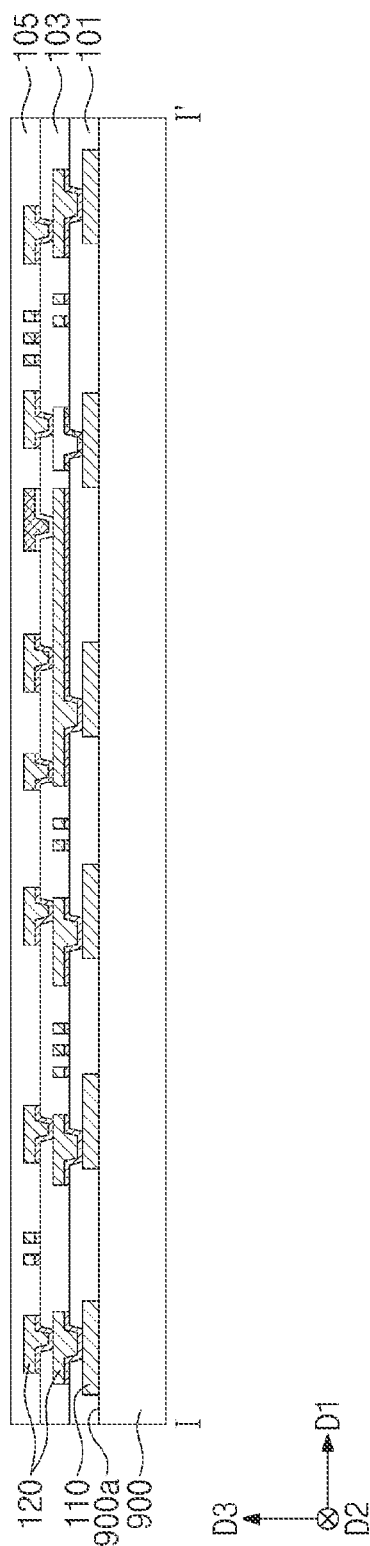
FIGS. 11 to 19 illustrate cross-sectional views showing a method of fabricating a semiconductor package according to some example embodiments.

Referring to FIG. 11, lower conductive patterns 110, first, second, and third dielectric layers 101, 103, and 105, and redistribution patterns 120 may be formed on a carrier substrate 900.

A release layer (not shown) may be interposed between the carrier substrate 900 and the lower conductive patterns 110 and between the carrier substrate 900 and the first dielectric layer 101. The release layer (not shown) may attach the first, second, and third dielectric layers 101, 103, and 105 to the carrier substrate 900. The formation of the redistribution substrate 100 may include forming a seed layer, forming on the seed layer a resist pattern that has an opening, using the seed layer as an electrode to form a conductive layer in the opening, removing the resist pattern, patterning the seed layer, depositing a dielectric layer, and performing a patterning process.

For example, a seed layer (not shown) may be formed on the carrier substrate 900. The seed layer may cover a top surface 900a of the carrier substrate 900. A deposition process may be performed to form the seed layer. The seed layer may include a conductive material. For example, the seed layer may include copper, titanium, or an alloy thereof.

A resist pattern having an opening may be formed on the seed layer. The opening may define a shape of the lower conductive pattern 110. The opening of the resist pattern may expose a top surface of the seed layer. The resist pattern may include a photoresist material.

The seed layer in the opening may be used as an electrode to form the lower conductive pattern 110. The lower conductive pattern 110 may be formed by performing an electroplating process in which the seed layer is used as an electrode. The electroplating process may stop before the lower conductive pattern 110 extends onto a top surface of the resist pattern. A strip process may be performed to remove the resist pattern. Therefore, the seed layer may be externally exposed below the resist pattern.

The exposed seed layer may undergo an etching process to pattern the seed layer. Therefore, the top surface 900a of the carrier substrate 900 may be exposed between the lower conductive patterns 110. The first dielectric layer 101 may be formed on the lower conductive pattern 110. The first dielectric layer 101 may conformally cover the exposed top surface 900a of the carrier substrate 900 and top and lateral surfaces of the lower conductive pattern 110. The first dielectric layer 101 may be formed by a coating process, such as spin coating or slit coating. The first dielectric layer 101 may be patterned to form a via hole in which is formed a via part of the redistribution pattern 120. The first dielectric layer 101 may undergo a curing process to rigidly cure the first dielectric layer 101. The processes mentioned above may be repeatedly performed to form the lower conductive patterns 110, the first, second, and third dielectric layers 101, 103, and 105, and the redistribution patterns 120.

Figure 12:
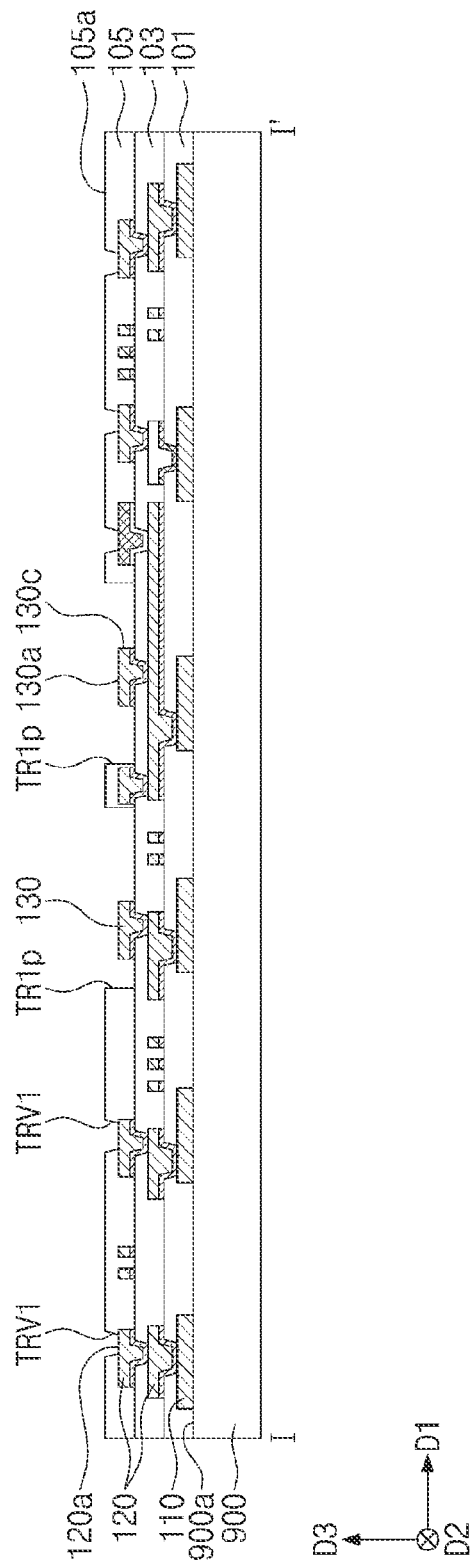

Referring to FIG. 12, the third dielectric layer 105 may be patterned to form via holes TRV1 and a first preliminary trench TR1p. The patterning of the third dielectric layer 105 may be achieved by exposure and development processes. The via holes TRV1 may expose top surfaces 120a of the redistribution patterns 120. The first preliminary trench TR1p may expose a top surface 130a and a lateral surface 130c of each of dummy redistribution patterns 130 that correspond to the redistribution patterns 120 in the first preliminary trench TR1p.

Figure 13:
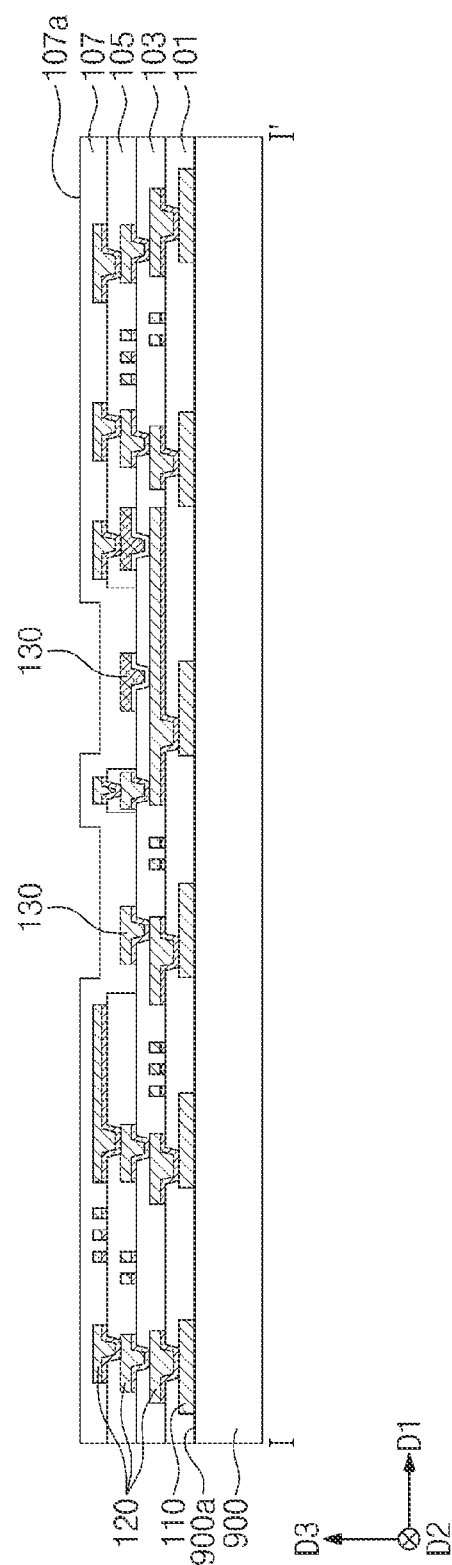

Referring to FIG. 13, a fourth dielectric layer 107 may be formed to cover the dummy redistribution patterns 130 and other redistribution patterns 120 that fill the via holes TRV1. The other redistribution patterns 120 filling the via holes TRV1 may be formed by the same method as that used for forming the redistribution patterns 120, which method is discussed with respect to FIG. 12. The fourth dielectric layer 107 may be formed by the same method as that used form forming the first dielectric layer 107. The fourth dielectric layer 107 may cover an uppermost redistribution patterns 120, and may fill the first preliminary trench TR1p. Therefore, the dummy redistribution patterns 130 provided in the first preliminary trench TR1p may have top and lateral surfaces that are covered with the fourth dielectric layer 107. In this case, the fourth dielectric layer 107 may have a top surface that has an undulation along the redistribution patterns 120 and an inner wall and a bottom surface of the first preliminary trench TR1p, but the present inventive concepts are not limited thereto.

Figure 14:
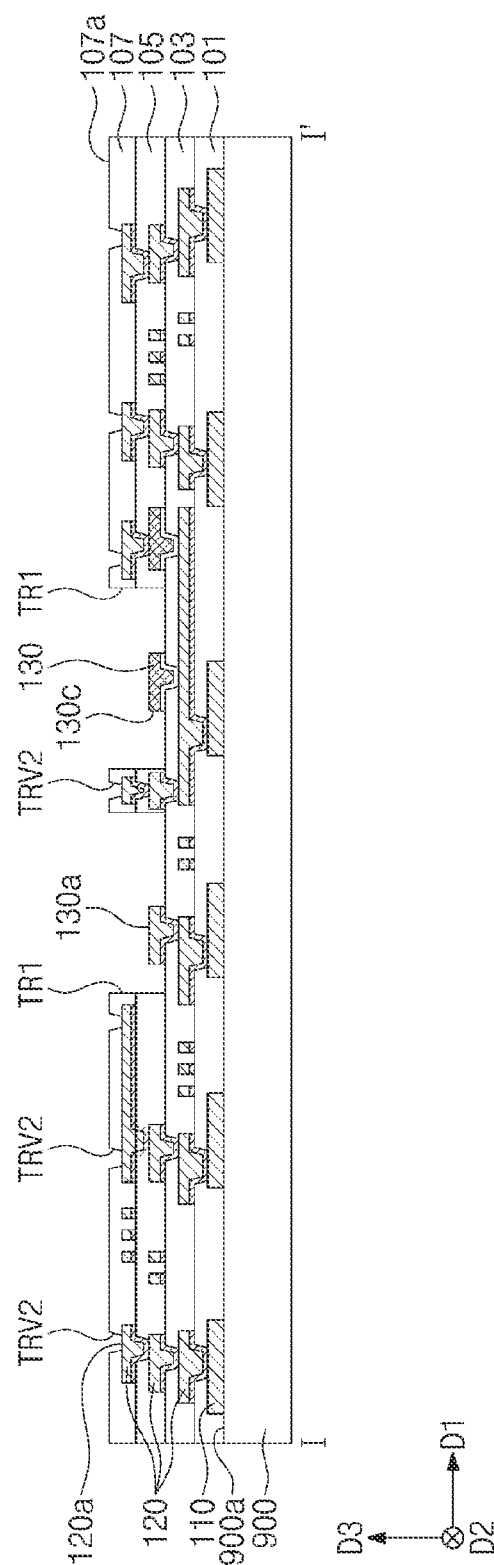

Referring to FIG. 14, the fourth dielectric layer 107 may be patterned to form via holes TRV2 and a first trench TR1. The fourth dielectric layer 107 may be patterned by using the same method as that used for patterning the third dielectric layer 105, as discussed with respect to FIG. 13. The via holes TRV2 may expose top surfaces 120a of uppermost redistribution patterns 120. The first trench TR1 may expose top and lateral surfaces 130a and 130c of each of the dummy redistribution patterns 130. The first trench TR1 may have a bottom surface that corresponds to an exposed top surface 103a of the second dielectric layer 103. The first trench TR1 may have an inner wall that includes a lateral surface 105c of the third dielectric layer 105 and a lateral surface 107c of the fourth dielectric layer 107, as illustrated in FIG. 2B.

Figure 15:
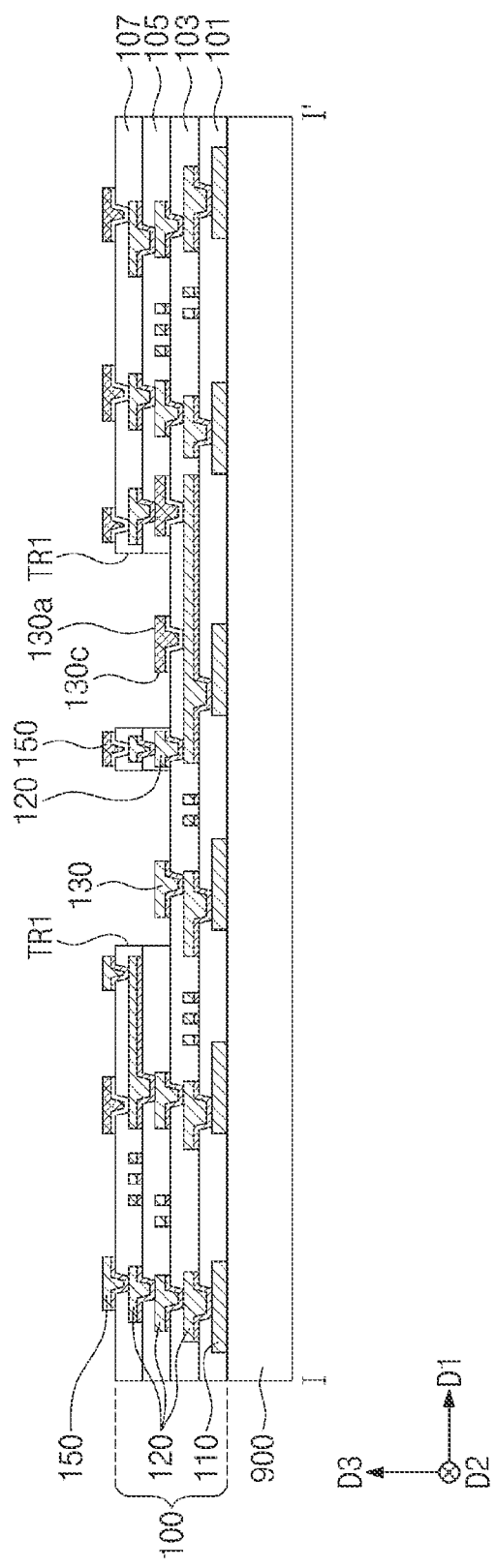

Referring to FIG. 15, a redistribution substrate 100 may be fabricated by forming upper conductive patterns 150 that fill the via holes TRV2. The upper conductive patterns 150 may be formed by the same method as that used for forming the redistribution patterns 120, as discussed with respect to FIG. 12.

When an external terminal is used to apply a power signal to a semiconductor chip mounted in a semiconductor package, removal of noise from the power signal may allow the semiconductor package to increase its operating reliability. A semiconductor package according to some example embodiments of the present inventive concepts may be configured such that a first semiconductor chip 210 may be provided on its bottom surface with a capacitor chip 400 capable of removing the noise, and that the capacitor chip 400 may be disposed in a first trench TR1 of the redistribution substrate 100, which configuration may increase effective utilization of space. In particular, at the same time when the redistribution substrate 100 is formed, the first trench TR1 may be formed without performing a separate process after the formation of the redistribution substrate 100. Accordingly, it may be possible to provide a semiconductor package whose process steps are reduced, whose manufacturing cost is cut down, and whose thickness is decreased.

Figure 16:
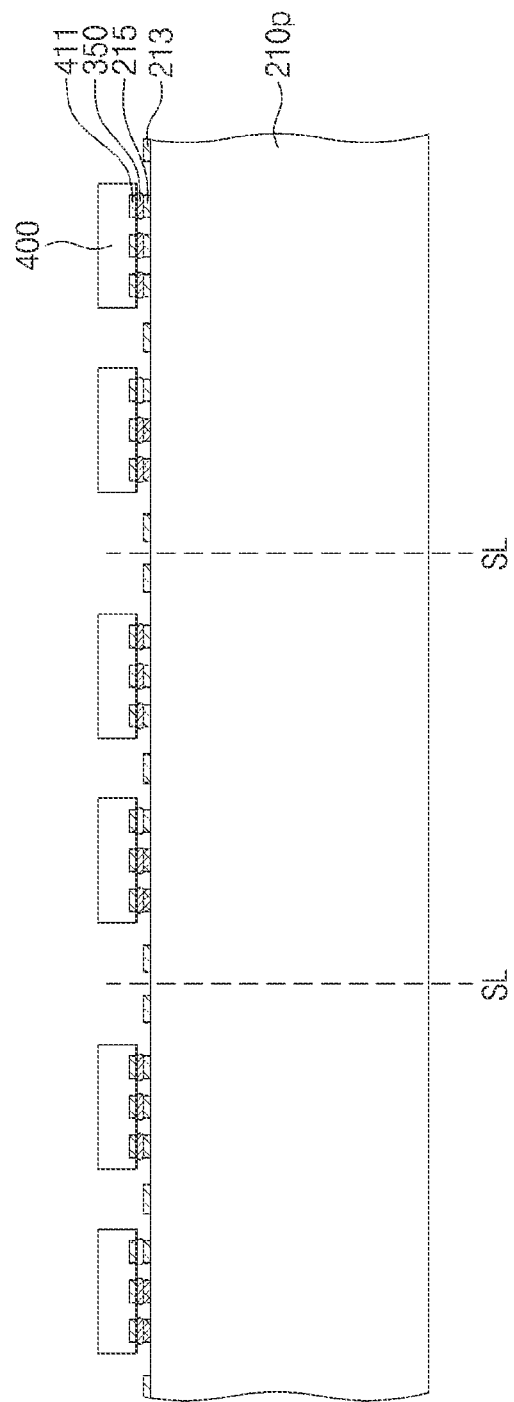

Referring to FIG. 16, a preliminary first semiconductor substrate 210p may be prepared. First chip pads 213 and second chip pads 215 may be formed on one surface of the preliminary first semiconductor substrate 210p. A capacitor chip 400 may be mounted on top surfaces of the second chip pads 215. A plurality of capacitor chips 400 may be mounted. Afterwards, the preliminary first semiconductor substrate 210p may be diced along a slice line SL to thereby fabricate first semiconductor chips on each of which the capacitor chips 400 are mounted.

Figure 17:
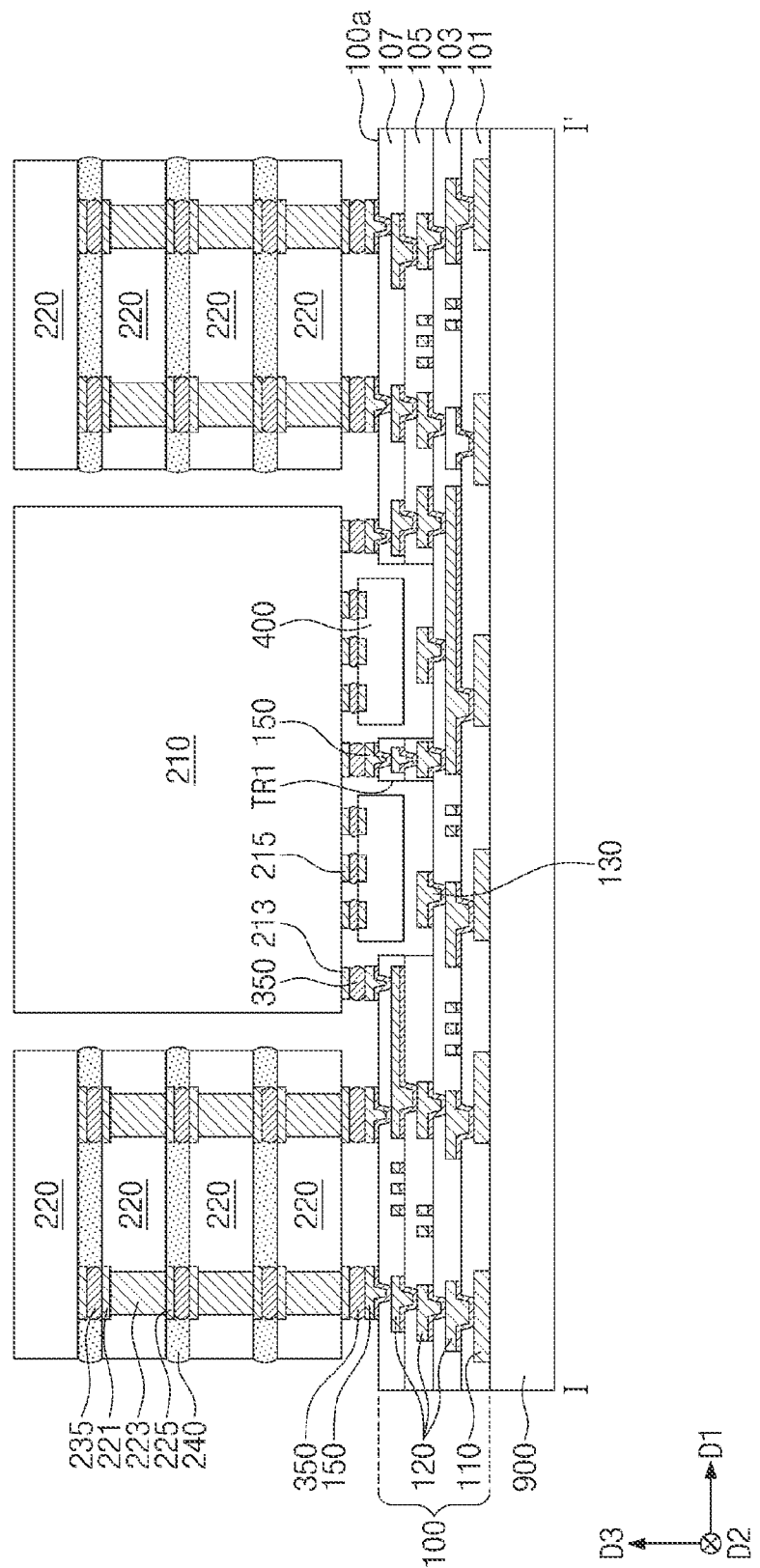

Referring to FIG. 17, the first semiconductor chip 210, on which the capacitor chips 400 are mounted, may be mounted on a top surface 100a of the redistribution substrate 100 as discussed with respect to FIG. 15. When the first semiconductor chip 210 is mounted, the first semiconductor chip 210 may be aligned to allow the capacitor chips 400 to face the top surface 100a of the redistribution substrate 100. The capacitor chips 400 may be provided in the first trench TR1 of the redistribution substrate 100. The capacitor chips 400 may be disposed such that their lateral and bottom surfaces may be spaced apart from the inner wall and the bottom surface of the first trench TR1. Chip stacks 250 may be mounted on the top surface 100a of the redistribution substrate 100. The chip stacks 250 may be horizontally spaced apart from the first semiconductor chip 210.

Figure 18:
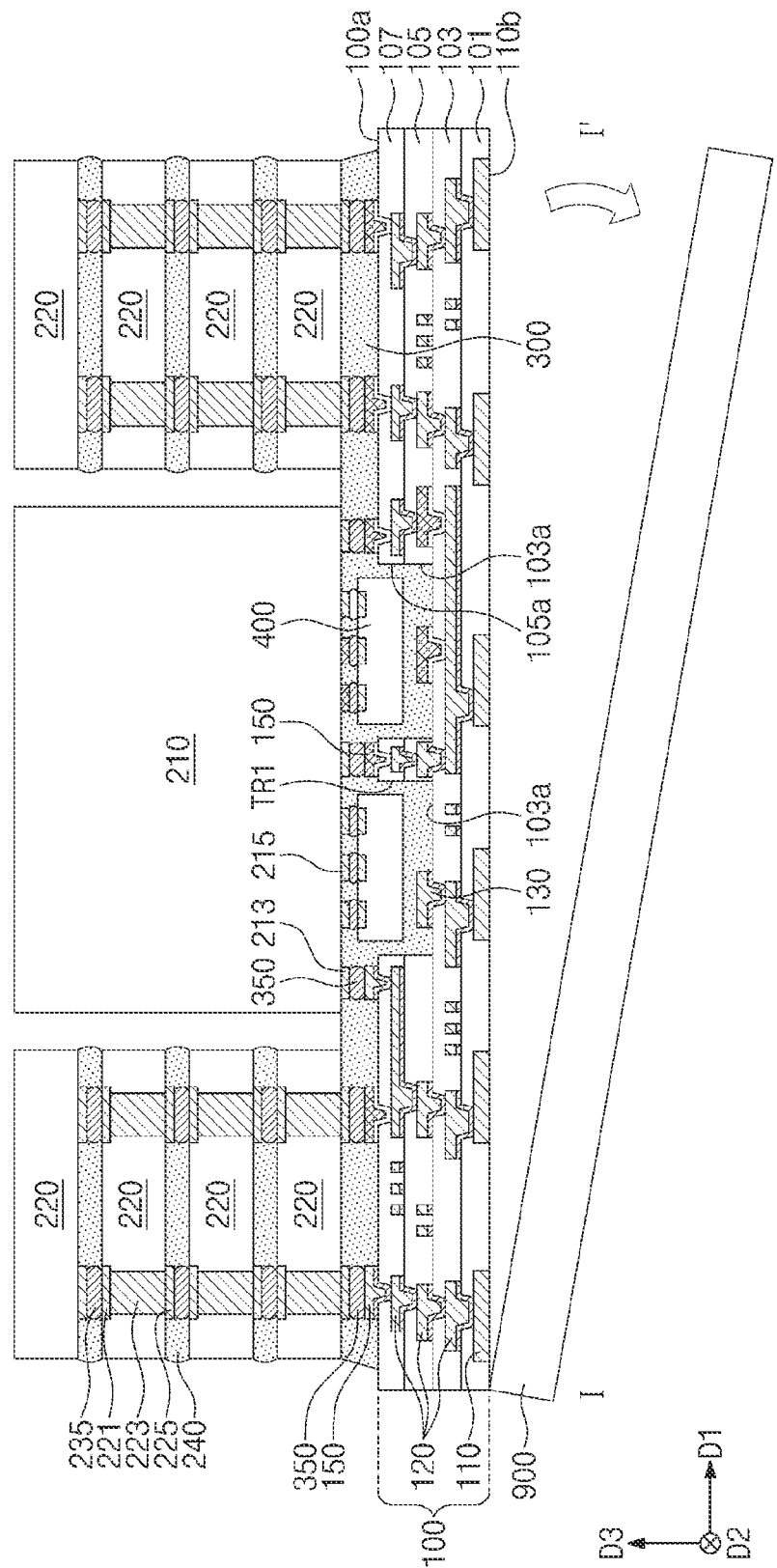
Figure 19:
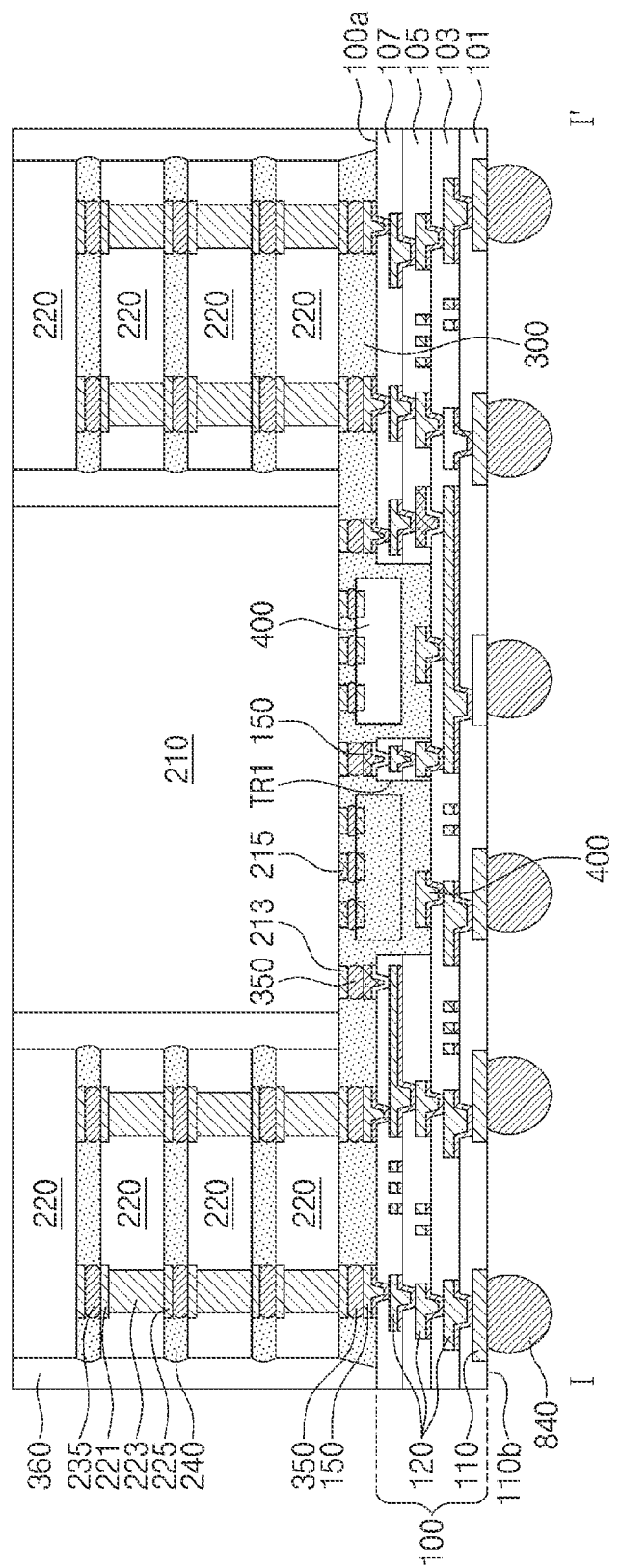

Referring to FIG. 18, an under-fill layer 300 may be formed between the first semiconductor chip 210 and the redistribution substrate 100 and between the redistribution substrate 100 and the chip stacks 250. The under-fill layer 300 may surround and encapsulate the capacitor chips 400 and the dummy redistribution patterns 130 exposed to the first trench TR1. An upper molding layer 360 may be formed to cover a lateral surface of the first semiconductor chip 210 and lateral surfaces of the chip stacks 250, as illustrated in FIG. 19. Thereafter, the carrier substrate 900 may be removed to expose a bottom surface of the first dielectric layer 101 and bottom surfaces 110b of the lower conductive patterns 110.

Referring to FIG. 19, external coupling terminals 840 may be formed on the exposed bottom surfaces 110b of the lower conductive patterns 110. The formation of the external coupling terminals 840 may include performing a solder-ball attachment process. The processes mentioned above may fabricate a semiconductor package according to some example embodiments of the present inventive concepts.

According to the present inventive concepts, a semiconductor chip may be mounted on a redistribution substrate that includes a trench. A capacitor chip may be provided on a bottom surface of the semiconductor chip, and the capacitor chip may be provided in the trench. Accordingly, it may be possible to provide a semiconductor package whose power signal noise is effectively removed and whose integration is increased.

This detailed description of the present inventive concepts should not be construed as limited to the embodiments set forth herein, and it is intended that the present inventive concepts cover the various combinations, the modifications and variations of this inventive concept without departing from the scope of the present inventive concepts.

What is claimed is:
1. A semiconductor package, comprising:
a redistribution substrate comprising:
 a plurality of dielectric layers vertically stacked;
 a plurality of redistribution patterns in each of the plurality of dielectric layers;
 a first trench that extends through a top surface of the redistribution substrate,
 wherein the first trench has a bottom surface that corresponds to a top surface of one of the plurality of dielectric layers, and an inner wall that corresponds to lateral surfaces of two or more of the plurality of dielectric layers; and
 a plurality of dummy redistribution patterns in the first trench;
a first semiconductor chip on the redistribution substrate;
a capacitor chip on a bottom surface of the first semiconductor chip; and
an under-fill layer on the bottom surface of the first semiconductor chip,
wherein the plurality of dummy redistribution patterns vertically overlap the first semiconductor chip,
wherein an uppermost surface of each of the plurality of dummy redistribution patterns is at a level higher than a level of a bottom surface of the first trench, and
wherein the dummy redistribution patterns are not electrically connected to the first semiconductor chip and are not electrically connected to the capacitor chip.

2. The semiconductor package of claim 1, wherein each of the plurality of the dummy redistribution patterns comprises a via part and a wire part on the via part,
wherein the wire part is on the bottom surface of the first trench, and
wherein the via part penetrates the bottom surface of the first trench and is connected to an adjacent redistribution pattern.

3. The semiconductor package of claim 2, wherein a top surface and a lateral surface of the wire part of each of the plurality of dummy redistribution patterns is in the first trench.

4. The semiconductor package of claim 1, wherein the under-fill layer is between the bottom surface of the first semiconductor chip and the bottom surface of the first trench, and wherein the under-fill layer surrounds the capacitor chip.

5. The semiconductor package of claim 1, further comprising a second semiconductor chip on the redistribution substrate,
wherein the under-fill layer extends onto a bottom surface of the second semiconductor chip, and is between the bottom surface of the second semiconductor chip and the top surface of the redistribution substrate.

6. The semiconductor package of claim 1, wherein a width in a first direction of the first trench is in a range of about 20 µm to about 50 µm, and wherein the first direction is parallel to a bottom surface of the redistribution substrate.

7. The semiconductor package of claim 1, wherein a ratio of a height of the first trench to a height of the redistribution substrate is in a range of about 0.1 to about 0.5.

8. The semiconductor package of claim 1, wherein the capacitor chip is in the first trench.

9. The semiconductor package of claim 1, wherein the capacitor chip comprises:
   a capacitor substrate;
   a first conductive layer on the capacitor substrate;
   a capacitor dielectric layer on the first conductive layer, the capacitor dielectric layer comprising a plurality of through holes; and
   a capacitance structure that is in the plurality of through holes,
   wherein the capacitance structure comprises titanium nitride.

10. A semiconductor package, comprising:
    a redistribution substrate comprising:
       a plurality of dielectric layers vertically stacked;
       a plurality of redistribution patterns in each of the plurality of dielectric layers; and
       a plurality of first trenches that extend through a top surface of the redistribution substrate;
    a first semiconductor chip on the redistribution substrate;
    a plurality of capacitor chips on a bottom surface of the first semiconductor chip;
    a blocking dielectric pattern between the plurality of first trenches, wherein each of the first trenches has an inner wall that corresponds to a respective lateral surface of the blocking dielectric pattern;
    an under-fill layer on the bottom surface of the first semiconductor chip; and
    a stack via between the plurality of capacitor chips,
    wherein the stack via is connected to the plurality of redistribution patterns and the first semiconductor chip, and
    wherein each of the plurality of first trenches has a bottom surface that corresponds to a top surface of one of the plurality of dielectric layers.

11. The semiconductor package of claim 10, wherein the plurality of capacitor chips are in the plurality of first trenches respectively, and wherein each of the capacitor chips has a width in a first direction that is less than a width in the first direction of the first semiconductor chip.

12. The semiconductor package of claim 10, wherein the stack via penetrates the blocking dielectric pattern.

13. The semiconductor package of claim 12, wherein the plurality of capacitor chips are spaced apart from each other across the blocking dielectric pattern.

14. The semiconductor package of claim 12, wherein the under-fill layer is between the bottom surface of the first semiconductor chip and bottom surfaces of the plurality of first trenches, and wherein the under-fill layer extends into a gap between the lateral surface of the blocking dielectric pattern and a lateral surface of each of the plurality of capacitor chips.

15. The semiconductor package of claim 10, wherein each of the plurality of first trenches has a height of about 2 µm to about 30 µm.

16. The semiconductor package of claim 10, wherein the first semiconductor chip further comprises:
    a plurality of first chip pads on the bottom surface of the first semiconductor chip; and
    a plurality of first connection terminals, each one of the plurality of first connection terminals on a bottom surface of a respective one of the plurality of first chip pads,
    wherein the stack via is in contact with the first connection terminal.

17. The semiconductor package of claim 16, wherein the stack via comprises a plurality of conductive vias vertically stacked,
    wherein each of the plurality of conductive vias comprises a via part and a wire part on the via part,
    wherein the wire part of an uppermost one of the plurality of conductive vias is in contact with the first connection terminal, and
    wherein the via part of a lowermost one of the plurality of conductive vias is in contact with one of the redistribution patterns.

18. The semiconductor package of claim 10, wherein each of the plurality of capacitor chips comprises:
    a capacitor substrate;
    a first conductive layer on the capacitor substrate;
    a capacitor dielectric layer on the first conductive layer, the capacitor dielectric layer comprising a plurality of through holes; and
    a capacitance structure that is in the plurality of through holes,
    wherein the capacitor substrate comprises a silicon substrate, and
    wherein the first conductive layer comprises tungsten.

19. A semiconductor package, comprising:
    a redistribution substrate comprising:
       a plurality of dielectric layers vertically stacked;
       a plurality of redistribution patterns in each of the plurality of dielectric layers, each of the plurality of redistribution patterns including a wire part and a via part; and
       a plurality of first trenches that extend through a top surface of the redistribution substrate, wherein each of the plurality of first trenches has a bottom surface that corresponds to a top surface of one of the plurality of dielectric layers, and a first inner wall that corresponds to lateral surfaces of two or more of the plurality of dielectric layers;
    a conductive terminal on a bottom surface of the redistribution substrate;
    a first semiconductor chip on the redistribution substrate, the first semiconductor chip comprising a plurality of first chip pads and a plurality of second chip pads;
    a plurality of capacitor chips on the plurality of second chip pads of the first semiconductor chip, each of the plurality of capacitor chips comprising a plurality of capacitor chip pads;
    a plurality of first connection terminals between the plurality of capacitor chips and the plurality of second chip pads;
    an under-fill layer on a bottom surface of the first semiconductor chip;
    a plurality of upper conductive patterns, each upper conductive pattern on the wire part of a respective one of uppermost ones of the plurality of redistribution patterns and connected to the first semiconductor chip;
    a plurality of lower conductive patterns, each lower conductive pattern on the via part of a respective one of lowermost ones of the plurality of redistribution patterns and connected to the conductive terminal;

a blocking dielectric pattern between the plurality of capacitor chips, wherein each of the plurality of first trenches has a second inner wall that corresponds to a respective lateral surface of the blocking dielectric pattern; and a stack via that penetrates the blocking dielectric pattern and is on the plurality of redistribution patterns, wherein the stack via is connected to the plurality of redistribution patterns and the first semiconductor chip.

20. The semiconductor package of claim 19, wherein the under-fill layer extends into a first gap between one of the respective lateral surfaces of the blocking dielectric pattern and a lateral surface of the capacitor chip and a second gap between a bottom surface of each of the plurality of first trenches and a bottom surface of each of the plurality of capacitor chips, thereby surrounding the plurality of capacitor chips.

* * * * *